(12) United States Patent
Gunn et al.

(10) Patent No.: US 7,282,944 B2
(45) Date of Patent: Oct. 16, 2007

(54) BODY CAPACITANCE ELECTRIC FIELD POWERED DEVICE FOR HIGH VOLTAGE LINES

(75) Inventors: Colin N. Gunn, Victoria (CA); Simon H. Lightbody, Victoria (CA); J. Bradford Forth, Victoria (CA); Martin A. Hancock, Victoria (CA); Geoffrey T. Hyatt, Victoria (CA)

(73) Assignee: Power Measurement, Ltd., Saanichton (CA)

( * ) Notice: Subject to any disclaimer, the term of this patent is extended or adjusted under 35 U.S.C. 154(b) by 0 days.

(21) Appl. No.: 10/774,088

(22) Filed: Feb. 6, 2004

(65) Prior Publication Data

US 2005/0017751 A1    Jan. 27, 2005

Related U.S. Application Data

(60) Provisional application No. 60/490,318, filed on Jul. 25, 2003.

(51) Int. Cl.
*G01R 31/36* (2006.01)
(52) U.S. Cl. ..................................... 324/771
(58) Field of Classification Search ............... 324/126, 324/127, 142, 765, 158.1, 763, 771; 340/870.17
See application file for complete search history.

(56) References Cited

U.S. PATENT DOCUMENTS

| | | | |
|---|---|---|---|
| 3,477,024 A | 11/1969 | Pelta | |
| 4,009,477 A | 2/1977 | Rozylowicz | |
| 4,142,178 A * | 2/1979 | Whyte et al. | 307/149 |
| 4,233,546 A | 11/1980 | Berthiaume | |
| 4,384,289 A | 5/1983 | Stillwell et al. | |
| 4,611,207 A | 9/1986 | Anderson et al. | |
| 4,709,399 A | 11/1987 | Sanders | |

(Continued)

FOREIGN PATENT DOCUMENTS

| | | |
|---|---|---|
| WO | WO 00/52483 | 9/2000 |
| WO | WO 02/082105 A1 | 10/2002 |
| WO | WO 2004/068151 A1 | 8/2004 |

OTHER PUBLICATIONS

Andrew Klimek, B.Sc., M.Sc., "Optical Technology: A New Generation of Instrument Transformer." Electricity Today, Ontario, Canada, Mar. 2003, pp. 38-39.

(Continued)

*Primary Examiner*—Ha Tran Nguyen
*Assistant Examiner*—Tung X. Nguyen
(74) *Attorney, Agent, or Firm*—Workman Nydegger

(57) ABSTRACT

Devices that couple to high voltage transmission lines obtain power themselves using the body capacitance of an element of the devices. The devices generate a comparatively lower voltage from the current flowing between the high voltage line and the element of the device that generates the body capacitance. The devices can be used to operate sensors that monitor the transmission lines or parameters of the power distribution system, such as current, line temperature, vibration, and the like. The devices can also be used as indicators, such as aircraft warning lights, information signs, etc. In addition, the devices can operate as RF transmission/reception or repeater devices, radar devices, mesh networking nodes, video/audio surveillance, sound emitting devices for scaring animals, drones that traverse the power line, etc. Because the devices operate in response to line voltage rather than current, the devices are reliable even in low current conditions.

100 Claims, 9 Drawing Sheets

U.S. PATENT DOCUMENTS

| | | | |
|---|---|---|---|
| 4,724,381 | A | 2/1988 | Crimmins |
| 4,758,962 | A | 7/1988 | Fernandes |
| 4,791,361 | A | 12/1988 | Beihoff et al. |
| 4,795,973 | A | 1/1989 | Smith-Vaniz et al. |
| 4,799,005 | A * | 1/1989 | Fernandes .................. 324/127 |
| 4,829,298 | A * | 5/1989 | Fernandes ............. 340/870.27 |
| 4,886,980 | A | 12/1989 | Fernandes et al. |
| 4,894,785 | A | 1/1990 | Fernandes |
| 5,181,026 | A | 1/1993 | Granville |
| 5,235,861 | A | 8/1993 | Seppa |
| 5,448,138 | A | 9/1995 | Staggs |
| 5,517,864 | A | 5/1996 | Seppa |
| 5,559,430 | A | 9/1996 | Seppa |
| 5,656,931 | A | 8/1997 | Lau et al. |
| 5,705,905 | A | 1/1998 | Wood |
| 5,808,424 | A | 9/1998 | Osgood |
| 5,918,288 | A | 6/1999 | Seppa |
| 6,470,283 | B1 | 10/2002 | Edel |
| 6,646,859 | B2 | 11/2003 | Vahamaki et al. |
| 6,671,635 | B1 | 12/2003 | Forth et al. |
| 6,933,835 | B2 * | 8/2005 | Kline ......................... 375/258 |
| 2001/0015149 | A1 | 8/2001 | Montambault et al. |
| 2003/0200038 | A1 | 10/2003 | Schweitzer, III et al. |

OTHER PUBLICATIONS

K.E. Holbert and G.T. Heydt, "Prospects for Dynamic Transmission Circuit Ratings," IEEE International Symposium on Circuits and Systems (ISCAS), Sydney, Australia, May 2001, vol. 3, pp. 205-208.

E. F. Donaldson et al., "Autonomous Current Sensing for High Voltage Systems with Auxiliary Optical Energisation," Sensor Review, England. Apr. 2001, Feb. 2001, pp. 126-132.

N.D. Sadanandan et al., "Power Donut System Laboratory Test and Data Analysis," IEEE: Proceedings—1990 Southeastcon, New Orleans, LA, Mar. 1990, pp. 675-679.

Engelhardt et al., "Design, Installation and Field Experience with an Overhead Transmission Dynamic Line Rating System," IEEE 1995, pp. 366-370.

U.S. Department of Transportation; Federal Aviation Administration, "Advisory Circular AC70/7460-1K: Obstruction Marking and Lighting," Aug. 2000, pp. 1-34 Appendices 1 and 2.

U.S. Department of Transportation; Federal Aviation Administration, "Advisory Circular AC150/5345-43E: Specification for Obstruction Lighting Equipment," Oct. 1995, pp. 1-16.

Analog Devices, "Single-Phase Multifunction Metering IC with di/dt Sensor Interface," ADE 7753, 2003.

U.S. Appl. No. 06/795,226, Fernandes, Abandoned.

Departamento de Engenharia de Linhas de Transmissão—ER/LT, GLT/16, Grupo III, Grupo De Estudos De Linhas De Transmissão (GLT), Aumento Da Capacidade De Transmissão DE Linhas Aé, utilizando Cabo CAA De Liga De Alumínio Termorresistênte.

\* cited by examiner

US 7,282,944 B2

BODY CAPACITANCE ELECTRIC FIELD POWERED DEVICE FOR HIGH VOLTAGE LINES

CROSS-REFERENCE TO RELATED APPLICATIONS

This application claims the benefit under 35 U.S.C. §119 (e) of U.S. Provisional Application Ser. No. 60/490,318, "Body Capacitance Electric Field Powered AC Line Sensing System", filed Jul. 25, 2003, which is incorporated herein by reference.

BACKGROUND OF THE INVENTION

1. The Field of the Invention

The present invention relates to devices operative to be coupled to high voltage electric power lines.

2. The Relevant Technology

Typically when it is necessary for a power company to transmit electrical power over long distances, it is transmitted at relatively high voltages. These high voltages are often much higher than the voltages used by customers of the electric power. When a voltage greater than 1 kilovolt (kV) and less than 40 kV is used for a particular power line, the power line is typically referred to as a distribution line. When a voltage greater than 40 kV is used, the power line is typically referred to as a transmission line. Transmission lines are generally used to transmit larger amounts of power over greater distances than distribution lines.

When a producer of electric power wants to connect to the electric grid, a connection can be made at either distribution line or transmission line level depending on the capacity of the producer's generating plant. Increasingly, due to deregulation in the power industry, the producer's generating plant is not owned by the same company as the transmission and distribution lines the plant will connect to. These types of producers are often referred to as independent power producers (IPPs). Since the power lines and the generating plant are not owned by the same company, it becomes much more important to accurately determine the amount of power the plant is feeding into the electrical grid through the transmission or distribution lines. Even when the generating plant and the power lines are owned by the same company, it is often advantageous to accurately monitor the amount of power being fed into the electrical grid.

IPPs will often only produce power when the demand for power is such that it is economical to do so. Therefore some IPPs may only produce power for a small percentage of time during a year. When the IPP is not feeding power into the grid, its generators are normally shut down and the IPP actually draws power from the electrical grid. The amount of power drawn from the grid in this situation is usually much smaller than when the IPP is generating power. A power usage by the IPP that is only $1/1000^{th}$ of its power generation capability or less is quite possible when the plant is idle. It is often desirable that the IPP be accurately billed for the energy it consumes during idle periods and accurately compensated for energy generated during active periods.

It is desirable for the energy meter and other instrumentation monitoring the flow of power to and from the producer to accurately measure both the power usage when the producer is idle and the power production when the producer is operating. This means that accurate energy metering and monitoring over a wide dynamic range such as 1000 times may be necessary. The energy metering and monitoring is often done at grid level voltages. Therefore, the voltage does not vary greatly (perhaps by +/−10% of its nominal value). This means that the wide variation in power flow seen by the energy metering and monitoring equipment is primarily due to the variation in current.

An energy meter capable of measuring over a wide dynamic range of current is described in U.S. patent application Ser. No. 10/341,079 to Hyatt et al. and entitled "Energy Device with an Extended Dynamic Range on Current Readings" which is incorporated herein by reference.

Using an energy meter with a wide dynamic range capability for current is part of the solution for accurately monitoring the flow of power to and from a producer. Energy meters for this type of application are typically connected through external current and voltage sensors. At least the current sensors themselves should also have a wide dynamic range. Optical current sensors such as those described in the document entitled "OPTICAL TECHNOLOGY: A NEW GENERATION OF INSTRUMENT TRANSFORMER" by Klimek published in Issue 2/2003 of Electricity Today have often provided the largest dynamic range. These sensors are often mounted on large insulator stacks and weigh 100 s of kilograms.

The installation costs for sensors mounted to high voltage transmission lines may often be significant. In fact, the installation cost may be more than the cost of the sensor itself in some cases. Some of the reasons for this include the large size and weight of the sensors and the downtime that is experienced when installing, re-installing or replacing a defective sensor. Most of the weight and size of many of these sensors is the insulator used to isolate the sensor from ground and support the sensor.

Another consideration that must be taken into account when accurately accounting for energy produced and consumed by a producer is that the instrumentation may have to be regularly calibrated to ensure accuracy. This means that the sensors may be regularly un-installed and sent for calibration while a replacement sensor is installed. This results in the install/re-install costs as well as significant shipping costs due to the weight of the sensors. This recalibration interval may be approximately every three years and the install-reinstall costs for a single sensor may be in the neighborhood of $100,000 US.

Sensors that power themselves using the magnetic field generated by the current flowing through the line they are monitoring are also available. One such device is described in U.S. Pat. No. 4,799,005 to Fernandes entitled "Electrical Power Line Parameter Measurement Apparatus and Systems, Including Compact, Line-Mounted Modules". Although this device may enable decreased install-reinstall costs, but because it is powered from the magnetic field generated by the current flowing through the line it is measuring, it may not be usable when the line current varies over a wide dynamic range. This is due to the fact that the magnetic field generated at low current may not be adequate to generate enough power to power the device or the current transformer ("CT") and associated circuitry used to power the device may be too complex or expensive to be practical.

High voltage electric power lines criss-cross the landscape. These lines pass over waterways, valleys, highways, through and around cities, etc. They are sometimes visible to observers on the ground. They are sometimes not particularly visible to aircraft. This is especially a problem where they cross vast expanses such as over valleys or waterways where there is a long distance between support towers. Transmission line support structures are often illuminated with obstruction lights through the employment of low voltage AC mains distribution power supply means and standard red incandescent obstruction light fixtures as specified by the Federal Aviation Advisory Circular 150/5345-43E. Identification of the actual transmission line catenary wires is often limited to the suspension of passive, brightly painted spheres. These afford little aeronautical identification at nighttime or under conditions of reduced visibility.

Recent technical advances have resulted in the ability to attach obstruction lighting directly to high voltage transmission line wires through a number of self-powering means not requiring connection to an external power source. Federal Aviation Advisory Circular AC 70/7460-1K now provides guidelines detailing the use of direct catenary wire obstruction lighting. U.S. Pat. No. 5,448,138 entitled "Aeronautical obstruction light" describes a device capable of direct obstruction illumination that extracts power through magnetic coupling using a coupling coil mounted in proximity of the power line. P and R Technologies of Beaverton, Oreg., offer a number of self-powered transmission line obstruction markers. Their SpanFlash™ series of transmission line markers employ a magnetic field power supply that requires a minimum of 50 Amperes for correct operation combined with a gas discharge lighting solution. This technique does not work when transmission line currents fall below a lower limit that results in insufficient magnetic field to support adequate power generation. Many transmission lines, particularly those coming from independent power producers, experience wide operating current ranges depending on load conditions.

BRIEF SUMMARY OF THE INVENTION

According to one of various aspects of the invention, an apparatus couples to a power line carrying a high AC line voltage. The apparatus has a conductive body with a body capacitance. The apparatus further has a power supply with at least two input terminals, including a first input terminal coupled to the conductive body and a second input terminal coupled to the power line. The power supply is coupled with electronic circuitry and converts power flow between the conductive body and the power line into a supply of power for the electronic circuitry at a voltage that is substantially lower than the high AC line voltage.

As further described herein, the invention also has other aspects that convert power flow between a conductive body and a power line into a supply of power for electronic circuitry. The present invention is defined by the following claims, and nothing in this summary should be taken as a limitation on those claims. Further aspects and advantages of the invention are discussed below in conjunction with the preferred embodiments.

BRIEF DESCRIPTION OF THE DRAWINGS

It is appreciated that the accompanying drawings depict only typical embodiments of the invention and are therefore not to be considered limiting of its scope. Embodiments of the invention will be described and explained with additional specificity and detail through the use of the drawings in which.

DETAILED DESCRIPTION OF PRESENTLY PREFERRED EMBODIMENTS

Figure 1:
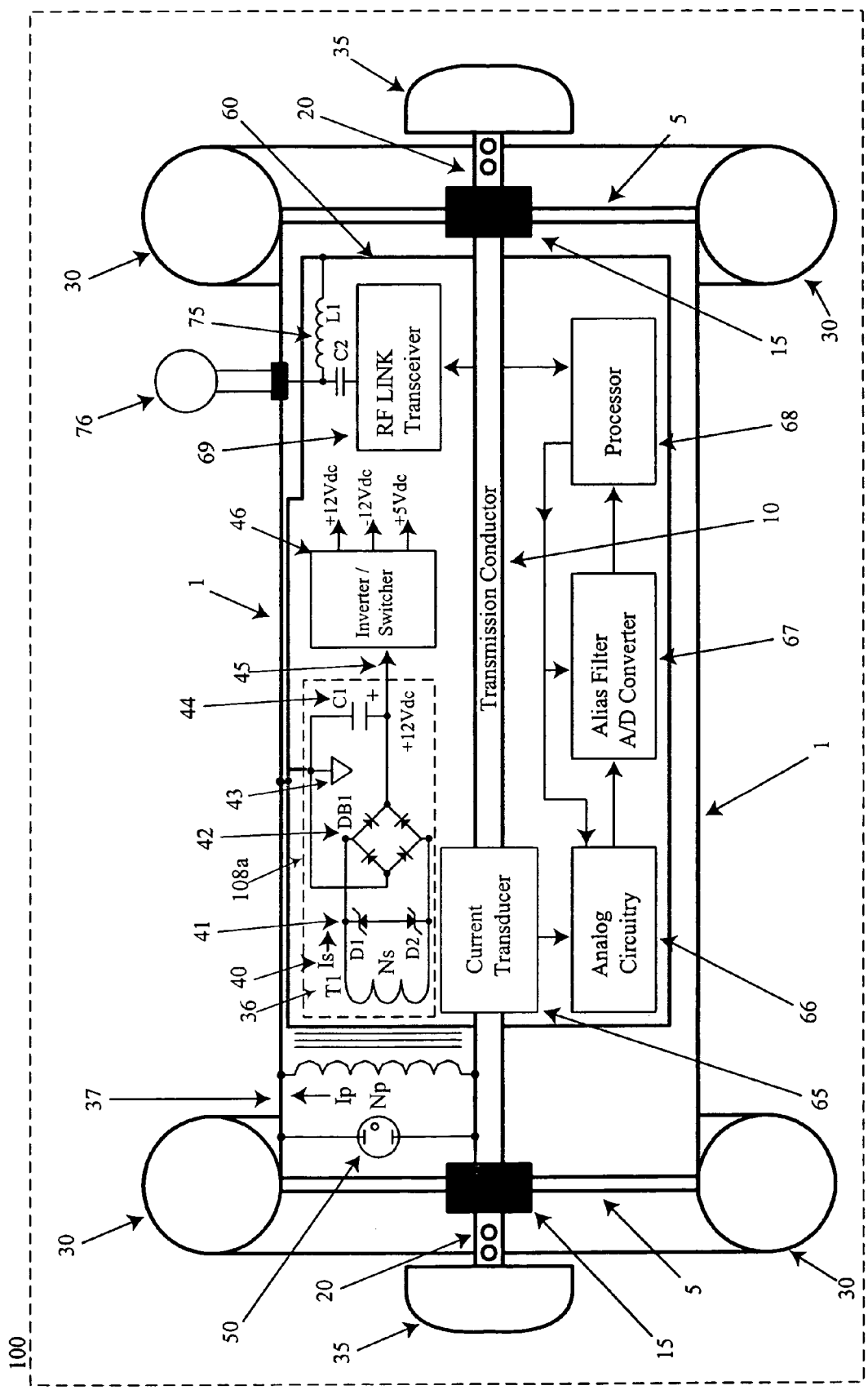
FIG. 1 depicts a cross section of one example of a high voltage transmission line attachable device of the present invention with both mechanical and electrical elements depicted.

The invention relates to devices that are attachable to high voltage transmission lines and power themselves by generating a comparatively lower voltage from the current flowing between the high voltage line and the body capacitance of an element of the device. One class of devices are sensors. Sensed parameters may include current, line temperature, vibration (due to arcing, corona or other effects), strain/tension (due to ice, wind loading, conductor breakage, tower collapse, etc.), electric field (which is indicative of the steady state and transient voltage on the line), lightning detection (transient or optical), etc. Another class of devices are indicators. Indicators may include aircraft warning lights, information signs, etc. Other devices include RF transmission/reception or repeater devices (such as for use with wireless phones), radar devices, mesh networking nodes, video/audio surveillance, sound emitting devices for scaring animals, drones that traverse the power line, etc. A common component of all these devices relates to the power supply energy source means for generating the comparatively lower voltage required for operation of the device.

As described in greater detail herein, the voltage required for operation of the device is substantially lower than the high AC line voltage. For example, the lower voltage associated with operation of the device is typically less than 100 Vdc. In many examples, a voltage of no more than 12 Vdc is required to operate the sensors, indicators, or other electronic components used in the devices described herein. In contrast, the high AC line voltage can range, for example, from 10 kVac to over 1000 kVac. A typical transmission line has high voltage of 230 kVac line to line (three phase) or 132.8 kVac line to Earth.

Prior art self-powered transmission line sensors, particularly for current measurement, come in a variety of forms as discussed above employing various transducer topologies and data transmission methods. Being self-powered provides an obvious benefit from an installation and high voltage ("HV") isolation standpoint. In many cases the powering energy comes from a variety of magnetic field methods whereby power is extracted through magnetic induction; typically through the use of a magnetic core and secondary winding clamped axially about the transmission line conductor. The primary difficulty with these methods is the reliance on sufficient line current required to produce sufficient magnetic field strength over some defined and wide dynamic range. At low line currents, for instance the line magnetization current of an idle IPP generating plant, it would be difficult to provide the energy required to power the sensor and its associated electronics (microprocessor, RF link, etc). If the line current is below a critical threshold then the sensor may cease to function completely. One constant is line voltage, which is generally always available. In general, when the voltage disappears in situations other than those associated with short lived transients, the line powering current also disappears and, therefore, there is no longer a need to measure many of the parameters.

Examples of the invention make use of the fact that a metallic or other conducting body (of arbitrary shape) has a body-to-earth capacitance through which an electric current can flow. The current and resulting voltage may be electronically converted to current and voltage levels usable for electronic device energy requirements without requiring a physical connection between two high voltage potentials, which could violate conditions of desirable electrical isolation.

The following description and figures describe various example devices that may be mounted to or form part of an electrical transmission line and derive operating power from the line. Each example device contains a power supply module generally referred to as element 108, and each variation of the power supply module is referred to as element 108a, 108b, 108c, etc. It is important to understand that each variation of the power supply module 108 may be interchangeable within the various example devices and still meet the objectives of the invention.

Referring now to FIG. 1, a high voltage transmission line attachable device ("HVTLAD") 100 mountable as a part of a high voltage transmission line is depicted. The HVTLAD 100 includes a cylindrical sensor body 1 that is formed from a conductive material (such as aluminum) casing having conductive end pieces 5 distributed radially and axially about a centrally located transmission conductor 10 that extends through the cylindrical sensor body 1 and beyond the conductive end pieces 5. The transmission conductor 10 is supported by and extends through two electrically insulating support bushings 15 in such a way to be mechanically connected but galvanically isolated from the electrically connected cylindrical sensor body 1 and conductive end pieces 5.

The transmission conductor 10 further includes end piece cable clamps 20 or other means for clamping the HVTLAD 100 in line with a power line conductor and allowing mechanical and electrical connection in a power transmission line system. It is appreciated that the transmission conductor 10 and cable clamps 20 are sized appropriately for the line current, tension, and interfacing requirements of a particular transmission line installation. Inclusion of strategically located and sized conductive toroidal corona rings 30 may prevent unwanted corona discharge in areas where small radius of curvatures dictate their placement. The size of the corona rings 30 is determined by the transmission line operating voltages and they are typically included at transmission line voltages over approximately 100 kVac. These toroidal corona rings 30 may be in galvanic and mechanical contact with the cylindrical sensor body 1 and conductive end pieces 5 and, apart from their corona reducing effect, provide additional body capacitance. Additional corona shields 35 may be fitted on the two ends of the transmission conductor 10. It is appreciated that the general geometry of the complete sensor body is not limited to the cylindrical shape described but may be of other shapes. It will be appreciated that body capacitance is a function of shape as well as surface area and the preferable shape for a given application is dictated primarily by the AC line operating voltages and spacing requirements. A completely spherical metallic sensor body such as those described below may be employed with similar performance without departing from the general operation as described.

The cylindrical sensor body 1 houses a power supply module 108a. Within the power supply module 108a, transformer T1 36 has a primary connection with Np turns connected between the transmission conductor 10 and the cylindrical sensor body 1. The cylindrical sensor body 1 is galvanically connected to the conductive end pieces 5 and toroidal corona shields 30. It is appreciated that the transmission conductor 10 is electrically isolated from the rest of the HVTLAD 100 through the insulator bushings 15 and that the transmission conductor 10 operates at high AC voltage levels with respect to earth ground. A small AC primary current Ip 37 flows through the primary winding into the cylindrical sensor body 1 as the result of the total body capacitance of the complete HVTLAD 100 and the high voltage on the transmission conductor 10. A typical high AC line voltage value ranges from 10 kV to over 1000 kVac with a typical transmission line value used for this discussion of 230 kVac line to line (three phase) or 132.8 kVac line to Earth.

The body capacitance, with respect to the Earth surface at transmission line heights is in the picofarad ("pF") range with a typical value for this discussion being 50 pF when the cylindrical sensor body 1 is about 1 meter long and 30 centimeters in diameter. The geometry of the HVTLAD 100, combined with the sensor height above the earth ground plane and the proximity of other conductors such as towers and other transmission conductors (other phase conductors) combine to determine the exact body capacitance. It is important to note that the exact body capacitance is not important provided that it is high enough to establish a sufficient operating primary current Ip 37 and that the reflected load impedance as presented at the primary winding of transformer T1 36 due to power supply loading is of high enough value to allow sufficient voltage division across the primary winding and effective body capacitance series connection.

The magnitude of primary current Ip 37 is determined by the transmission line voltage applied to the transmission conductor 10 and the reactive impedance of the total body capacitance at the particular line frequency (typically 50 or 60 Hz for most transmission lines deployed throughout the world) employed. For illustrative purposes, a body capacitance of 50 pF translates to a reactive impedance of 53 Megaohms at 60 Hz. This results in a reactive primary current Ip 37 of 132.8 kVac/53e6 equaling 2.5 mA RMS. The potential difference developed across the primary winding of transformer T1 36 is small in relation to the transmission conductor 10 potential (>132 kVac) with respect to earth ground and may be neglected in the calculation of primary current Ip 37 flow. The potential difference developed across the primary winding of transformer T1 36 (and thus the potential between the transmission conductor 10 and the body of the HVTLAD 100) is kept small in relation to the transmission conductor 10 potential due to the clamping action of an active device such as Zener diodes D1 and D2 41 as described below.

Transformer T1 36 may be constructed using a tape wound toroidal design and may employ very low-loss core materials in order to reduce primary magnetization currents to levels below the available driving primary current Ip 37 in order to achieve usable transformer action. It may also be designed with inter-winding capacitances kept to minimal levels. Transformer T1 36 functions as a step down transformer where the ratio of Np/Ns is greater than 1. As an example, a turns ratio of 80 is used but it is appreciated that other turns ratios may be employed. Primary current Ip 37 induces a secondary current Is 40 that is rectified through diode bridge DB1 42 and charges capacitor C1 44. The negative output of diode bridge DB1 42 is connected to system ground 43, which is galvanically bonded to the shielded electronics housing 60 which is also galvanically connected to cylindrical sensor body 1. This forms the "system" ground for all electronic circuitry. In this manner the transmission conductor 10 maintains a voltage differential with respect to the cylindrical sensor body 1 equal to the primary winding voltage developed across transformer T1 36. Capacitor C1 44 voltage builds up to a level of +12 Vdc, at which point, the secondary Zener diodes D1 and D2 41 clamp the secondary voltage to provide shunt regulation of the +12 Vdc supply voltage 45. The Zener diode clamping action limits transformer T1 36 secondary voltage to approximately 12.7 volts peak-to-peak. Transformer T1 36, through turns ratio Np/Ns transforms the clamped secondary voltage to approximately 1200 volts peak-to-peak at the primary winding. In this manner the high primary voltage of transformer T1 36, combined with low primary current, is converted to a low voltage at higher current operable to energize sensor electronics.

Inverter/Switcher block 46 may be provided to supply multiple outputs required by sensor electronics. It operates from the single, 12 Vdc supply voltage 45. It is appreciated that other voltage levels and combinations may be required for particular sensing applications without departing from the spirit of the invention. It is also appreciated that other secondary windings and rectifier circuitry could be added to transformer T1 36 in order to reduce the dependency on electronic switch mode voltage conversion circuitry.

A Gas Discharge Tube 50 may be provided to limit the primary voltage of transformer T1 36 under transient line conditions due to possible lightning strikes or other short duration line events. The Gas Discharge Tube 50 is characterized by having low inter-electrode capacitance (typically 1 pF), which is advantageous in order to prevent the diversion of body capacitive current from the transformer primary winding. It will be appreciated that other types of transient suppression devices may also be used.

A current transducer 65 is shown coupled to the transmission conductor 10. The current transducer 65 may have wide dynamic range covering from 100 mA RMS to over 2000 Arms (in the example although many other current ranges are possible). Suitable current sensing topologies include traditional toroidal magnetic core types, actively compensated zero flux types (active CTs), Hall effect, optical current transducers (a component of optical CTs), and Rogowski coils with each having certain advantages or disadvantages including accuracy, cost, weight, dynamic range, and useable bandwidth. An actively compensated core type may be employed when the high accuracy is required for revenue applications. A Rogowski coil may be employed when a high current dynamic range and/or high bandwidth is required for certain protective applications.

The output of the current transducer 65 is an analog signal that may require amplification and signal conditioning performed by the analog circuitry 66. This module may include selectable analog gain blocks under auto-ranging processor control. The analog output of the analog circuitry 66 may be connected to the Alias Filter and A/D module 67 which removes frequency components above ½ the sampling or Nyquist rate. The A/D converter digitizes the analog signal at the sample rate (for example 256 samples/second) and provides the digital information to the Processor module 68. The Processor Module 68 controls the analog circuitry 66 and Alias Filter and A/D Conversion 67 modules while processing and packetizing the A/D samples stream. The processor module 68 communicates with the RF data link transceiver 69, which is used to transmit the acquired current waveform to the coupled ground based receiver (not shown) where the waveform may be processed for power measurement or power quality information. The RF data link transceiver 69 may operate at VHF and higher frequencies and employ a robust modulation and error correction method to provide reliable and secure telemetry data in real time. In addition, the RF data link transceiver 69 and/or processor module 68 may implement encryption and/or authentication schemes to make it difficult to tamper with the data being transmitted and/or received.

The RF data link transceiver 69 is coupled to the antenna 76 through a reactive matching network 75 formed from L1 and C2. The purpose of matching network 75 is to effectively impedance match the output of the RF data link transceiver 69 to the antenna 76 and maintain the DC or low frequency potential of the exposed antenna 76 at the potential of the shielded electronics housing 60. Other inductances, capacitances, transmission line stubs, and/or transformer matching circuitry may be used to achieve similar functionality. The circuitry shown 75 is essentially a high pass filter with inductor L1 75 maintaining the zero DC and low frequency (50/60 Hz) potential of the antenna 76 with respect to the shielded electronics housing 60 common potential.

Cylindrical sensor body 1 may be split vertically into two separate sections that are insulated from one another. The first section may be used as previously described to derive operating power for the device. The second section may be used to sense the voltage on the transmission conductor 10 by monitoring current flow from the transmission conductor 10 to the body capacitance of the second section. A second transducer may thus be provided to supply an analog signal indicative of voltage in transmission conductor to analog circuitry 66. In this manner, processor 68 may directly calculate power parameters such as watts flowing through the transmission conductor due to the local availability of both current and voltage signal information before transmitting the data. Additionally, it may be possible to derive the voltage on the transmission conductor 10 by monitoring the primary current Ip 37 flow and using appropriate signal processing without the addition of the second section.

Additional transducers may also be interfaced to processor 68 and powered by inverter/switcher block 46. These additional transducers may include vibration, tension, temperature (both for the conductor and ambient temperature), lightning detector and other types of transducers.

Instead of using an RF data link transceiver 69, an RF transmitter may be used. In addition, the RF data link transceiver 69 may be replaced with a laser, fiber optic or other optical data transceiver or transmitter. This has the advantage of being extremely directional and therefore it is much more difficult to jam or tamper with the signal. RF has the advantage of being less susceptible to obstructions such as airborne particulates, fog, or objects physically blocking the signal path.

Processor 68 may be equipped for reception of an accurate time base. This time base may come from the RF data link transceiver 69 or may come from a separate time source such as a global positioning system (GPS) receiver. These may include a disciplined phase locked master clock oscillator. This allows the processor 68 to accurately timestamp the time of conversion of the A/D sample data that is to be transmitted through the RF data link transceiver 69. In addition, A/D sampling may be synchronized to the time source such that for instance sampling may start at a given time boundary (such as even second). This allows the accurate computation of power parameters (such as kW, kVAR, kVA, power factor, symmetrical components, etc.) by the ground based transceiver or computer/intelligent electronic device attached thereto. It also allows for comparison of phase calculations resulting from the sampling of multiple HVTLADs 100. A GPS receiver may also provide the location of the HVTLAD 100 to the processor 68. The location of the HVTLAD 100 may be transmitted through the RF data link transceiver 69 to a remote device, such as a computer, that is not physically coupled with the HVTLAD 100. The location may include the elevation of the sensor which may be useful in detecting transmission line sag due to broken insulators, overheated conductors, etc. Alternatively, the HVTLAD may comprise a radar or other altimeter for elevation determination. In addition, the location may include longitude and latitude information which may ease commissioning costs due to the fact that the location of the HVTLAD can be correlated with the expected location at the remote device. For instance, it may not be strictly necessary to record the location that any given HVTLAD is installed since the HVTLAD can transmit its location and other configuration information to a remote device. This may be valuable when determining grid stability as described below.

HVTLAD 100 may be constructed in "clamp-on" form. In this case, transmission conductor 10 is the transmission line of a power system. Cylindrical sensor body 1 may be constructed in a manner operable to split horizontally as oriented in FIG. 1 and may be placed over the transmission line and clamped together. In this case, cable clamps 20 and additional corona shields 35 may not be provided.

Figure 2:
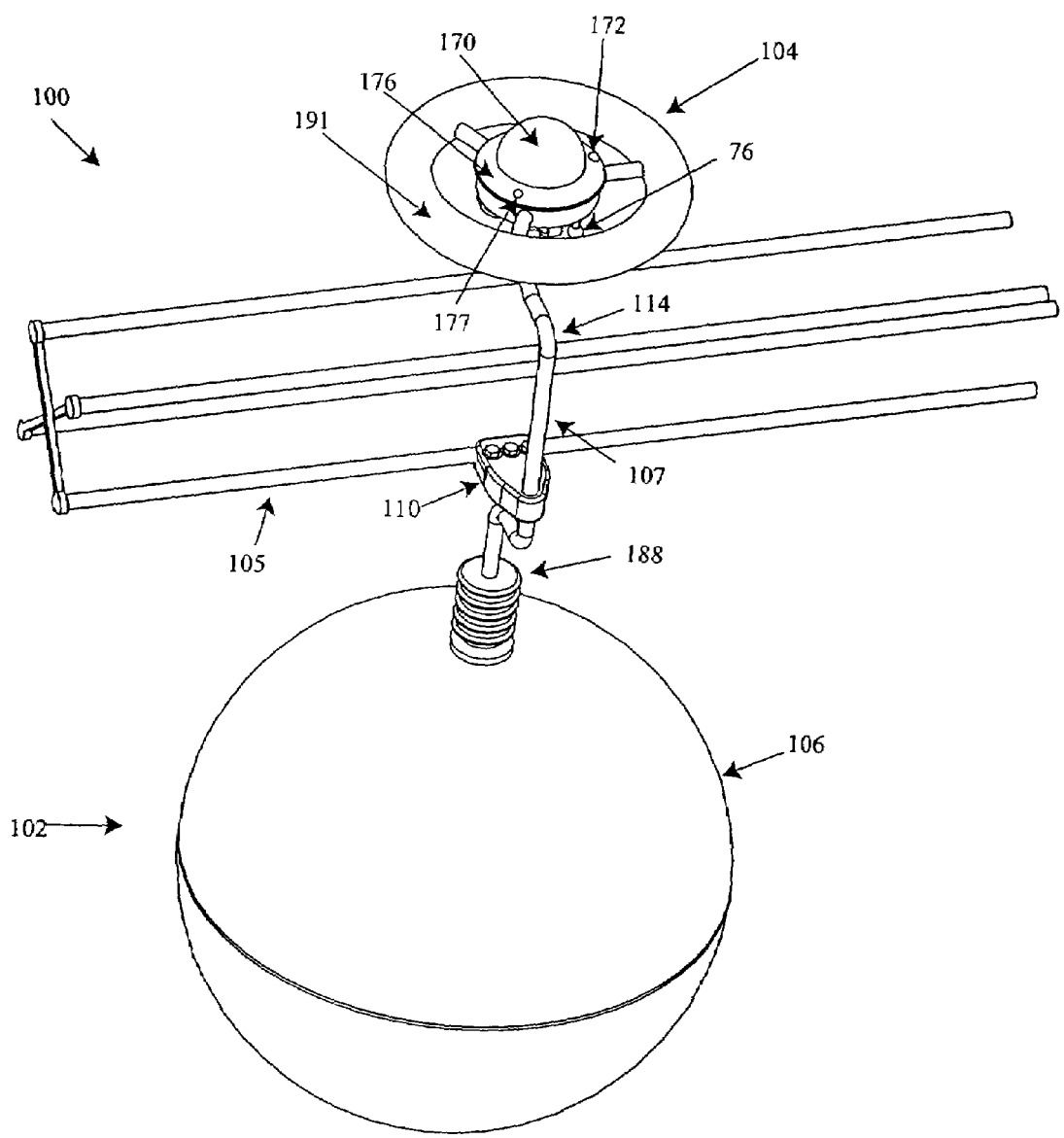
FIG. 2 depicts a second example of a high voltage transmission line attachable device of the present invention coupled to a power line.

Referring now to FIG. 2, a second example of the HVTLAD 100 is shown. This example of the HVTLAD 100 includes three component sections; an electric field energy source 102, overhead wire conductive support tube 107, and electronic obstruction light beacon module 104.

The electric field energy source 102 includes a conductive sphere 106, preferably made with aluminum or other electrically conductive material, and a tubular conductive support tube 107 that extends through the conductive sphere 106, and is coupled to both ends of the conductive sphere 106 through insulators 188. The conductive support tube 107 is therefore galvanically isolated from the conductive sphere 106. It is appreciated that the conductive support tube 107 is at the high electric potential of the transmission line 105 to which the complete HVTLAD 100 is attached through a clamp 110 or other attachment means which makes electrical and mechanical contact with the transmission line 105. Variations of the clamp 110 as depicted in the FIGS. 2, 3 and 8, may be required for affixing the HVTLAD 100 to varying transmission line cable sizes and configurations including single, dual, and quad high voltage line configurations. A curved feature 114 of the conductive support tube 107 allows positioning of the HVTLAD 100 directly over and centered on the transmission line 105 wire (s) in order to reduce the rotational torque applied by the clamp 110.

Figure 3:
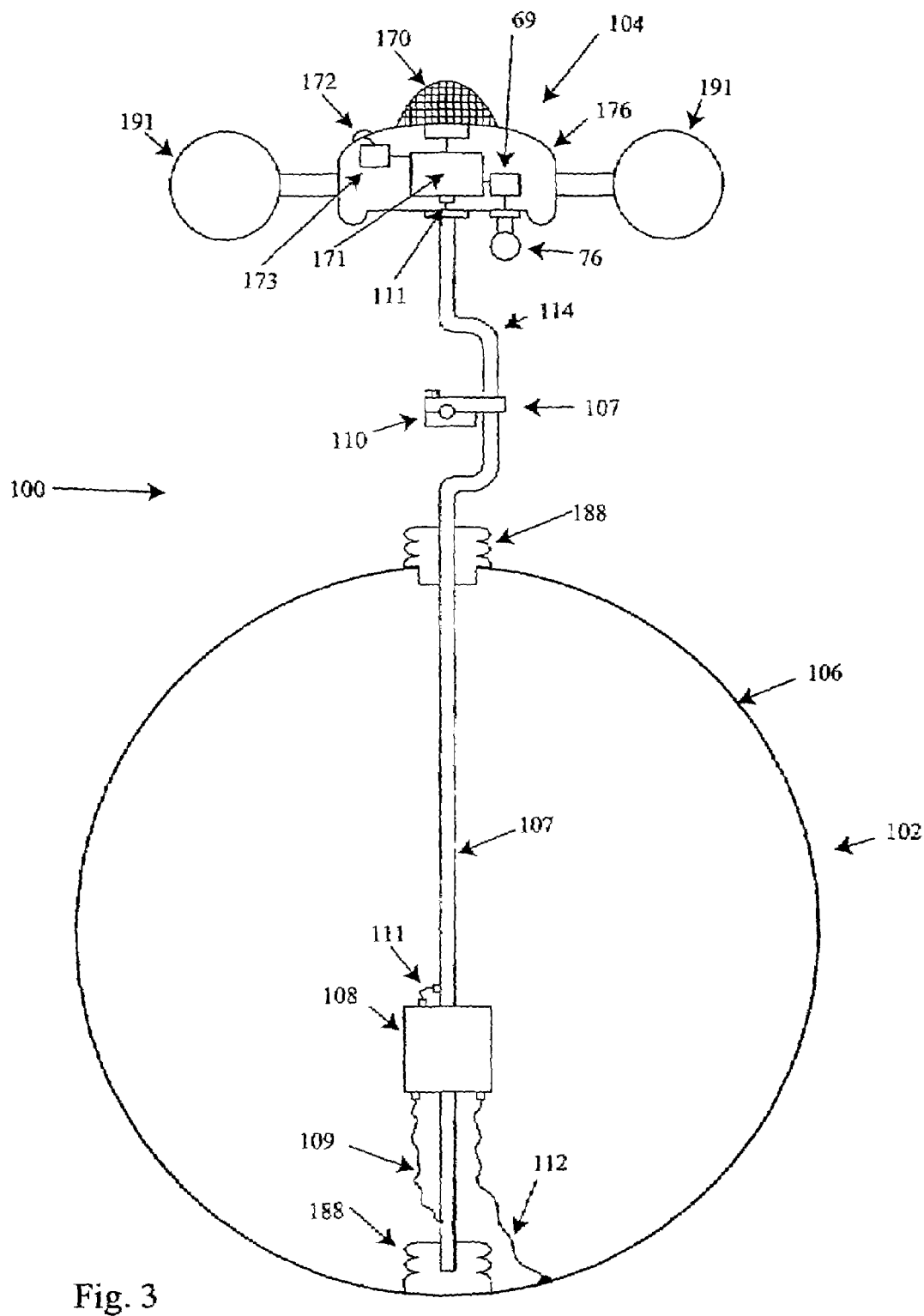
FIG. 3 depicts a cross section of the second example of a high voltage transmission line attachable device of the present invention.

Referring now to FIG. 3, the electric field energy source 102 further includes a power supply module 108 mounted to the conductive support tube 107 within the conductive sphere 106. Input connection to the power supply module is provided through wire connection 112 made to the galvanically isolated conductive sphere 106 and a second wire connection 109 made to the conductive support tube 107 that allows the power supply module to be coupled to the transmission line 105 through the conductive support tube 107 and clamp 1110. The power supply module 108 common or effective "ground" connection is made through the second wire connection 109. The positive DC output is provided to a multi-conductor wire cable 1111 that is routed through the conductive support tube 107 to the electronic obstruction light beacon module 104. The multi-conductor wire cable 111 may additionally carry a serial communications link connection 138 between the power supply microcontroller U1 130 and the obstruction light controller 150. The conductive support tube 107 provides the negative or circuit common "ground" return path through second wire connection 109.

It will be appreciated that many modifications of the location of the various components in the HVTLAD 100 are possible without departing from the spirit and scope of the invention. For instance, in this example, power supply module 108 may be placed within electronic obstruction light beacon module 104 with appropriate wire connection(s) to conductive sphere 106 through conductive support tube 107.

Two examples of the power supply module 108b, 108c within the conductive sphere 106 are presented. The first embodiment utilizes a magnetically coupled technique while the second embodiment employs a switch-mode flyback topology. In both examples, the power supply module 108 functions to convert the low level capacitive reactive AC current flowing between the high voltage transmission line 105 and the galvanically isolated conductive sphere 106 into a low voltage +12 Vdc supply voltage 45 of higher current capability suitable for powering the electronic obstruction light beacon module 104 and power supply module 108 electronics. The power supply module 108 may provide +12 Vdc with a continuous power level of 1.3 watts when connected to a 230 kV ac transmission line. Higher line voltages result in increased power availability. A 740 kV ac transmission line may produce in excess of 4 watts of continuous power availability when utilizing a conductive sphere 106 of 1 meter in diameter having a free space capacitance of approximately 50 pF as defined by equation:

$$C = 4 \cdot \pi \cdot E_o \cdot r,$$

where C=capacitance in Farads, $E_o = 8.85 \times 10^{-12}$ $C^2/(N \cdot m^2)$, and r=the radius of the sphere in meters.

Figure 4:
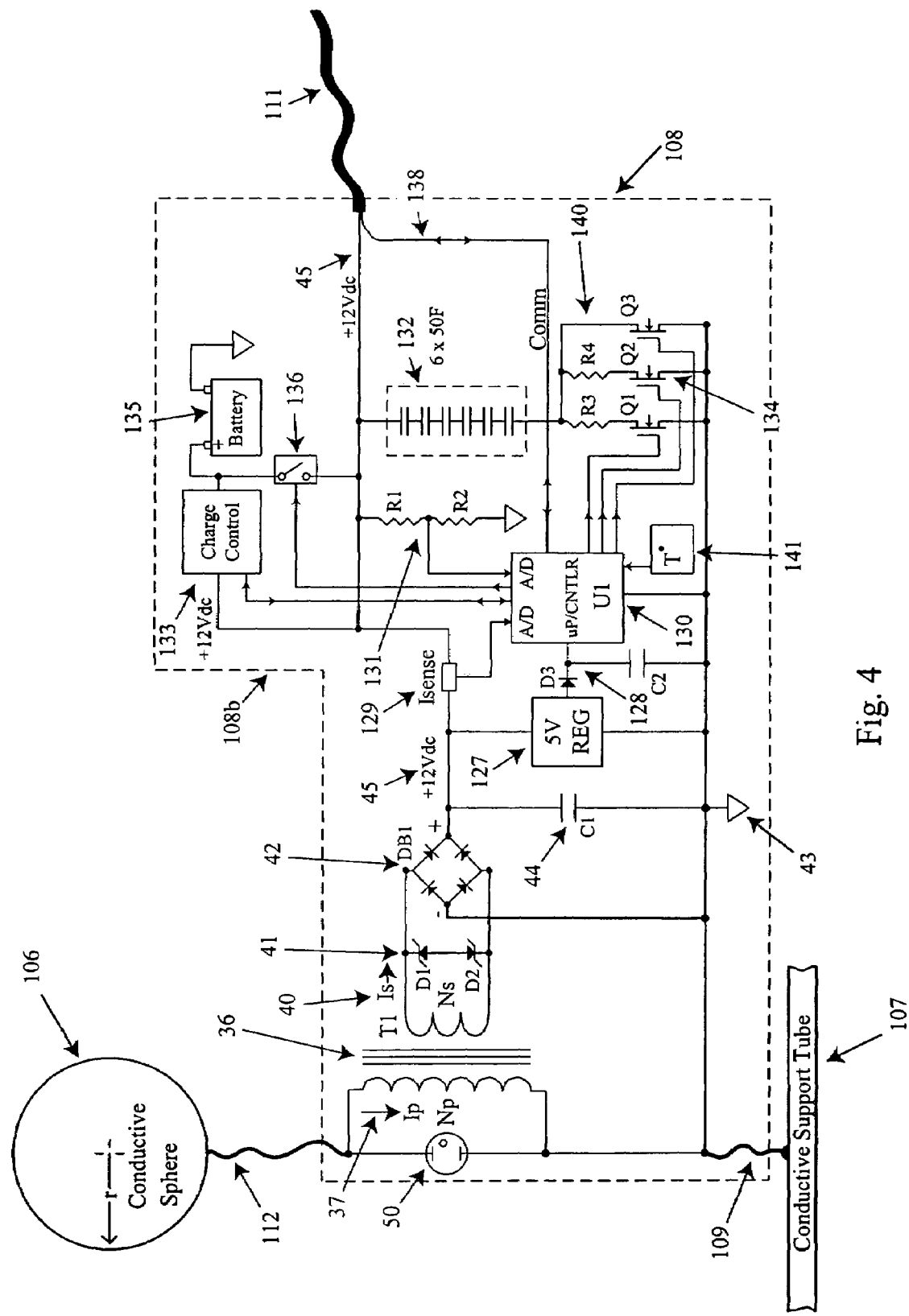
FIG. 4 depicts a schematic diagram of a second example of a power supply module of the present invention.

Referring now to FIG. 4, a second example of the power supply module 108b is shown. Transformer T1 36 has a primary connection with Np turns connected between the conductive support tube 107 and the galvanically isolated conductive sphere 106. It is appreciated that the conductive support tube 107 is additionally galvanically coupled to the transmission line 105 through a clamp 110. A small AC primary current Ip 37 flows through the primary winding into the conductive sphere 106 as the result of the total body or "free space" capacitance of the conductive sphere 106 and the high voltage transmission line 105 potential. A typical high AC line voltage value ranges from 10 kV to over 1000 kVac with a typical transmission line value used for this discussion being 230 kVac line to line or 132.8 kVac line to neutral (earth) potential. The conductive sphere 106 capacitance at transmission line heights is in the picofarad range with a typical value for this discussion being approximately 50 pF for a conductive sphere 106 of three feet in diameter. The limiting lower value of "free space" capacitance for a conductive sphere is provided by the equation shown above with capacitance being proportional to the radius of the conductive sphere. The conductive sphere 106 capacitance, as "seen" by the transmission line 105 and the connected and energized conductive support tube 107, has a lower "free space" limit established by the equation, but is also affected by the height above the earth ground plane and the proximity of other conductors such as towers and other transmission conductors.

It is important to note that the exact capacitance of the conductive sphere 106 is not particularly important provided that it is high enough to establish a sufficient operating primary current Ip 37 and that the reflected load impedance as presented at the primary winding of transformer T1 36, due to power supply loading, is of high enough value to allow sufficient voltage division across the primary winding of transformer T1 36 winding and conductive sphere 106 effective capacitance series connection. Higher or lower power levels may simply be achieved by adjusting the size and therefore capacitance, of the conductive sphere 106.

The electric field energy source 102 body geometry is not limited to spherical shapes but may include other geometries such as toroidal, cylindrical and planar topologies or combinations thereof. In FIG. 2, the electric field energy source 102 is shown hanging below the transmission line 105 wire(s) but may also be located in other positions or electrically combined in parallel with other conductive bodies in order to increase total body capacitance and power generation capability. The electric field energy source 102 may also be of tubular shape, positioned coaxially either completely or partially around but insulated from the transmission line 105 wire(s) as shown in FIG. 1. The selection of the geometry of the electric field energy source 102 at high transmission line potentials is normally be influenced more by attempting to prevent corona discharge and radio interference through the use of sufficient radii of curvature in order to reduce electric field intensities to non-ionizing levels. A three foot diameter conductive sphere 106 mounted below the catenary transmission line wire(s) as shown in FIG. 2 may provide sufficient capacitance and corona rejection for up to 500 kV line to line potentials while additionally providing a passive visual Federal Aviation Administration painted (orange and white) obstruction marker.

The magnitude of primary current Ip 37 is determined by the transmission line voltage applied to the conductive support tube 107 and the reactive impedance provided by the total body capacitance on the conductive sphere 106 at the particular line frequency (typically 50 or 60 Hz) employed. For illustrative purposes, a body capacitance of 50 pF translates to a reactive impedance of −j53 Megohms at 60 Hz. This results in a reactive primary current Ip 21 of 132.8 kVac/−j53e6 equaling j2.5 mA RMS. The potential difference developed across the primary winding of transformer T1 36 is small in relation to the conductive support tube 107 potential (>132 kVac) and therefore may be neglected in the estimation of primary current Ip 37 flow. The potential difference developed across the primary winding of transformer T1 36 (and thus the potential between the conductive sphere 106 and the rest of the body of the HVTLAD 100) is kept small in relation to the transmission line 105 potential due to the clamping action of an active device such as Zener diodes D1 and D2 41 as described below.

In order to reduce primary magnetization current to a level significantly below the available driving primary current Iip 37 it may be necessary to use a transformer T1 36 incorporating a tape wound toroidal design employing low-loss magnetic core material to achieve useable transformer action. Conventional silicon-steel power transformers suffer from core losses that may result in magnetization current well above the available driving primary current Ip 37 source. A representative transformer may be wound on a Magnetics Incorporated 50100-4F Supermalloy™ toroidal tape wound core. Other low loss core materials; such as MetGlas™ and Permalloy™ may be used, particularly at higher transmission line voltages which translate into higher driving primary current Ip 37 levels. Transformer T1 36 functions in the step down configuration where the ratio of Np/Ns is greater than 1. As an example, a turns ratio of 80, with 10,000 primary turns and 125 secondary turns, may used but it is appreciated that other turns ratios may be employed to obtain different output voltage levels and current levels. A high number of primary turns is employed on the primary winding of transformer T1 36 in order to simultaneously support a high primary voltage, a flux level optimized for low core loss, and a small magnetic core cross section.

Primary current Ip 37 induces a secondary current Is 40 that is rectified through diode bridge DB1 42 and charges capacitor C1 44. The negative output of diode bridge DB1 42 is connected to system ground 43, which is galvanically bonded to the conductive support tube 107 through second wire connection 109. This forms the "system" ground for all electronic circuitry in both the power supply module 108b and electronic obstruction light beacon module 104. In this manner the conductive support tube 107 maintains a voltage differential with respect to the conductive sphere 106 equal to the primary winding voltage developed across transformer T1 36. Capacitor C1 44 voltage builds up to a level of +12.7 Vdc, at which point the secondary 12 Volt Zener diodes D1 and D2 41 clamp the secondary AC voltage to provide shunt regulation of the +12 Vdc supply voltage 45. The Zener diode clamping action limits transformer T1 36 secondary AC voltage to approximately 12.7 volts peak-to-peak of clipped sinusoidal waveshape. Transformer T1 36, through turns ratio Np/Ns transforms the clamped secondary voltage to approximately 1016 volts peak-to-peak across the primary winding. In this manner the high primary voltage of transformer T1 36, combined with low primary current Ip 37, through transformer action, is converted to a lower secondary voltage at higher secondary current Is 40 levels operable to power additional power supply module 108b and electronic obstruction light beacon module 104 electronics. Zener diodes D1 and D2 41 are of the power variety as they must be able to dissipate the full power supply output when the power supply module 108b is unloaded. Diode Bridge DB1 42 utilizes Schottky diodes in order to minimize diode potential drops and maximize system efficiency. A Gas Discharge Tube 50 may be provided to limit the primary voltage of transformer T1 36 under transient line conditions due to possible lightning strikes or other short duration line events. Alternatively other types of transient suppression devices may be used. It is appreciated that other power supply configurations are possible including using different turns ratios, clamping voltages means, multiple secondary output windings and configurations and various other component substitutions without departing from the spirit of the invention.

The remaining power supply module 108b circuitry is provided for storage of energy and communication of energy data to the electronic obstruction light beacon module 104. The +12 Vdc supply voltage 45 is reduced to 5 Vdc through regulator 127 to power microcontroller U1 130 having internal RAM, ROM, A/D, Digital I/O, and communications ports. Diode D3 and 1 Farad (or other value) capacitor C2 128 provide the microcontroller U1 130 with +12 Vdc supply voltage 45 outage "ride-through" capability allowing continuous control operation during load fault and transient events associated with high energy capacitor bank 132 and battery 135 charging. A Hall effect or other DC current sensor 129 provides power supply current data to microcontroller U1 130. Resistive divider R1 and R2 131 divides the +12 Vdc supply voltage 45 providing voltage level information to the A/D input channel of microcontroller U1 130. The power supply module 108b is additionally provided with a backup battery 135, charge control 133 and activation switch 136 all operating under microcontroller U1 130 management. The backup battery 135 provides continuous electronic obstruction light beacon module 104 power under conditions of transmission line 105 voltage sag or failure. Alternatively a super capacitor or other energy storage device may be used instead of backup battery 135.

The power supply module 108b may additionally include a high energy capacitor bank 132 having a combined total capacitance of 8.3 Farads which translates into 600 joules of energy storage at the supply level of +12 Vdc supply voltage 45. This high level of energy storage can be used for short term backup power in the event of transmission line 105 voltage sag or failure. The low impedance level afforded by the high energy capacitor bank 132 additionally provides high peak power reservoir capacity suited for intermittent (such as required for a flashing LED beacon array) high peak energy demand applications. Capacitors having values in the 0.1 to 50 Farad range combined with low effective series resistance suitable for high energy discharge rates are a relatively new technology. Representative types include the Cooper Industries Aerogel™ 50 Farad, 2.5 volt capacitor, part number B1840-2R5506 and, for even higher energy storage, the Maxwell Technologies BCAP0013 450 Farad, 2.5 volt capacitor.

Figure 6:
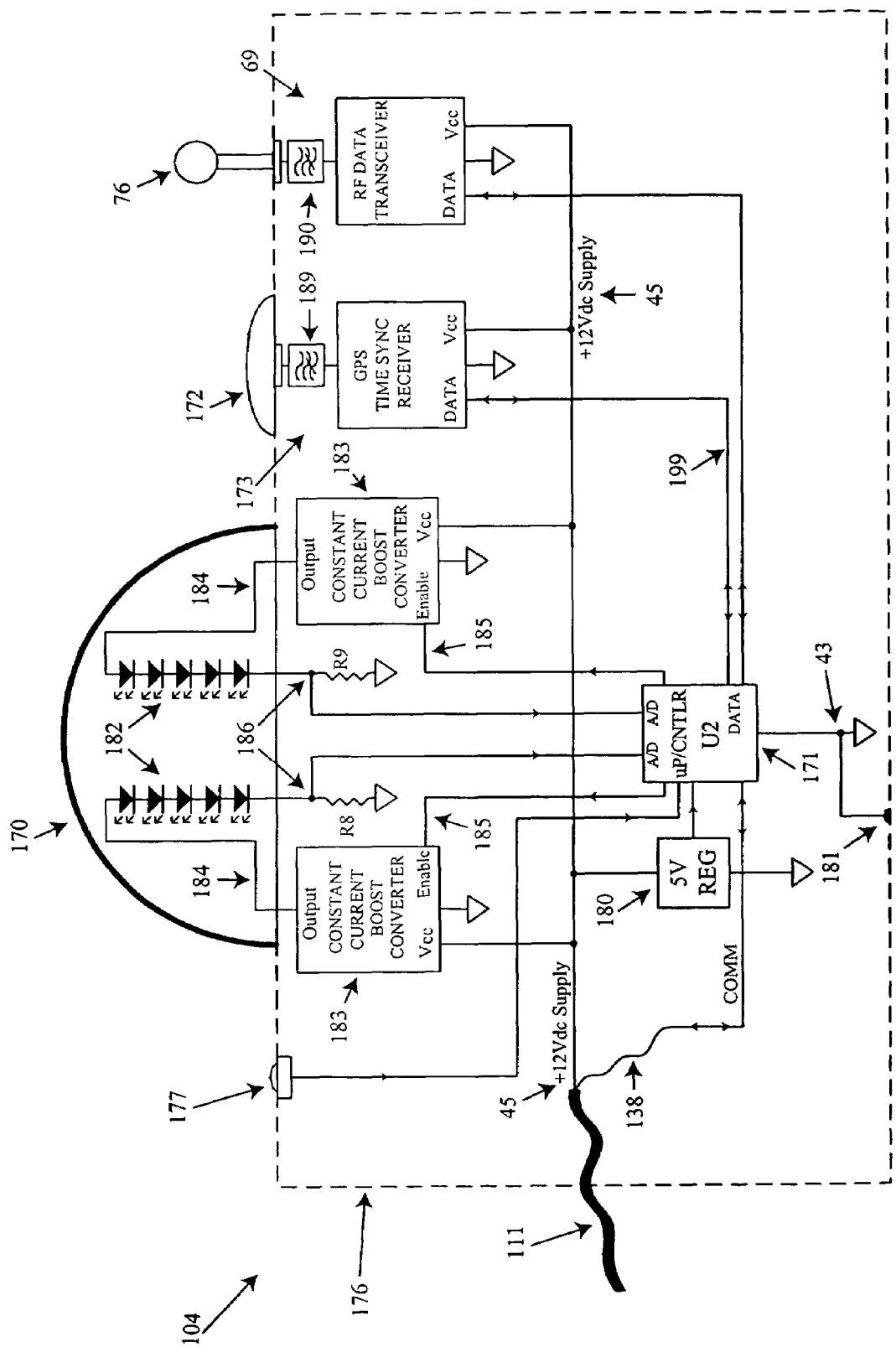
FIG. 6 depicts a schematic diagram of a portion of a second example of the high voltage transmission line attachable device of the present invention.

Microcontroller U1 130 provides charge control of the high-energy capacitor bank 132 through field effect transistor ("FET") switches Q1, Q2, and Q3 of FET bank 134. When not charged, the high-energy capacitor bank 132 may appear as a low impedance short circuit which may require controlled charging particularly when the driving +12 Vdc supply voltage 45 has limited current capability. Microcontroller U1, 130 through current (by DC current sensor 129) and voltage (by resistive divider R1 and R2 131) measurement determines, in real time, the available supply current that may be safely directed to charging the high-energy capacitor bank 132 without causing a significant voltage loss in +12 Vdc supply voltage 45 or detrimental transient condition. Resistors R3 and R4 140, through FET switches Q1 and Q2 of FET bank 134 provide a means of variable rate charging depending on the calculated available supply current. FET switch Q3 of FET bank 134 is turned on after the high-energy capacitor bank is fully charged effectively placing a low impedance between capacitor bank 132 and system ground 43. Capacitor bank is then capable of providing short term high peak power capability. A serial communications link 138 is provided to allow energy data and control information to be passed between the power supply module microcontroller U1 130 and the obstruction light microcontroller U2 171 (FIG. 6). Battery 135 charge information, supply current (measured by DC current sensor 129), +12 Vdc supply voltage 45, and supply module temperature from temperature sensor 141 may be transmitted via the RF data link transceiver 69 to a remote location for alarm and diagnostic purposes. Detection of transmission line 105 voltage failure is also possible by monitoring Isense supply current (through DC current sensor 129). If it drops to zero or reverses direction as the result of powering current for the microcontroller U1 130 flowing from the energy storage means instead of the transformer T1 36 then a transmission voltage failure is indicated and this status may be forwarded via the RF data link transceiver 69.

Figure 5:
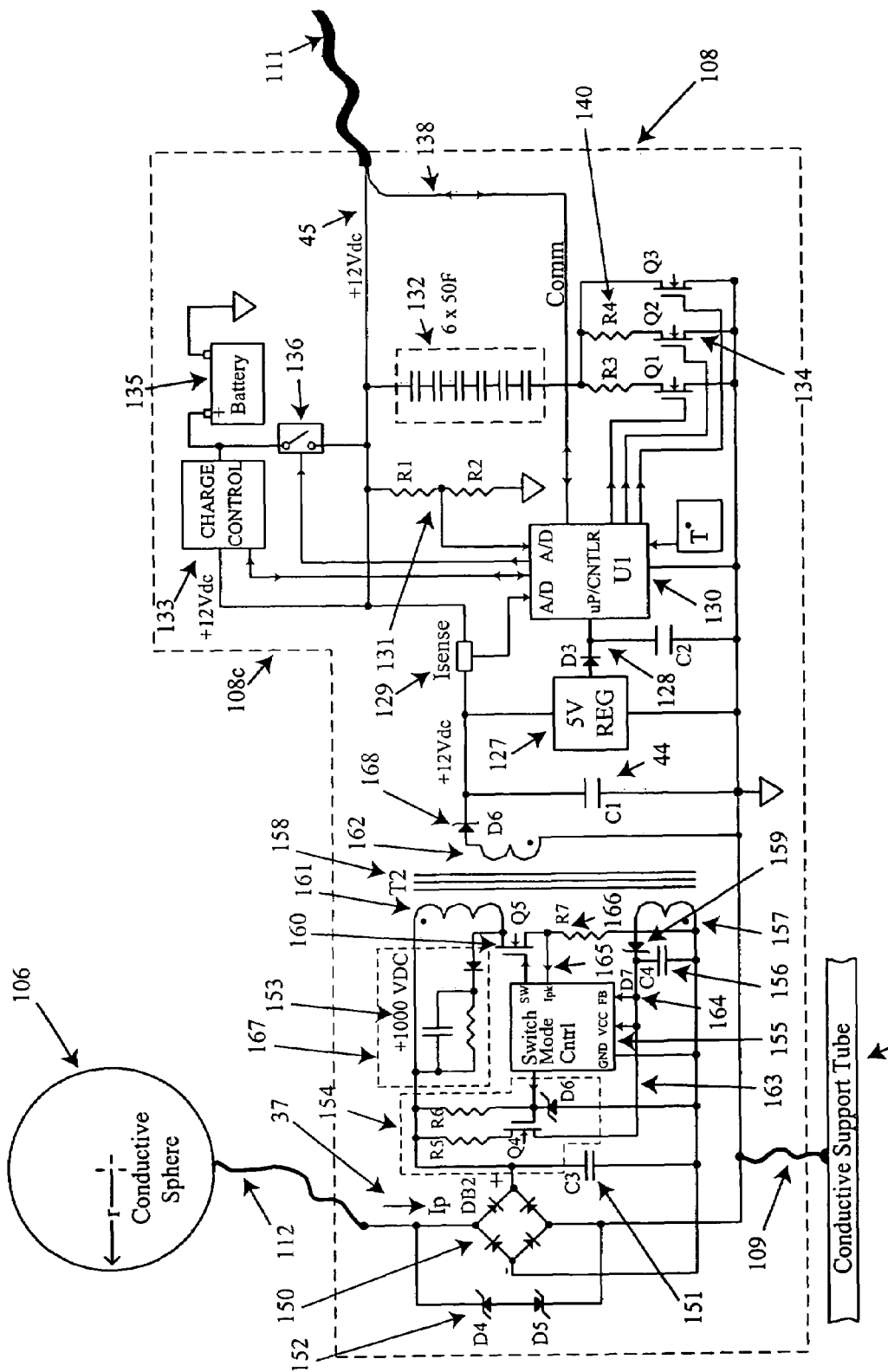
FIG. 5 depicts a schematic diagram of a third example of a power supply module of the present invention.

Referring now to FIG. 5, a third example of the power supply module 108c is shown. A small AC primary current Ip 37 flows through diode bridge rectifier DB2 150 charging capacitor C3 151. AC primary current Ip 37 flows as the result of the total body or "free space" capacitance of the galvancially isolated conductive sphere 106 and the high voltage transmission line 105 potential in a manner similar to that detailed in the previous examples of the power supply module 108. The DC voltage developed across capacitor C3 151 increases to approximately +1000 Vdc on high voltage dc supply 153 at which time high voltage Zener diodes D4 and D5 152 clamp the AC input voltage effectively limiting the maximum dc switch-mode supply input voltage to +1000 Vdc. The potential difference developed across the high voltage Zener diodes D4 and D5 152 (and thus the potential between the conductive sphere 106 and the rest of the body of the HVTLAD 100) is kept small in relation to the transmission line 105 potential due to the clamping action of the high voltage Zener diodes D4 and D5 152.

Bootstrap circuitry 154 initially provides startup power for the switch-mode controller 155, reverting to a high impedance state after transformer switching action successfully begins providing low voltage output 163. MOSFET Q4 is initially biased into conduction through a positive gate to source potential provided by Zener diode D6 and resistor R6. Switch-mode controller 155 supply filter capacitor C4 156 is charged through Q4 and R5 until a low voltage threshold is reached at which point the switch-mode controller 155 begins switching action. Capacitor C4 156 stores energy to provide sufficient startup time until switch-mode action provides operating voltage through the auxiliary power winding 157 of flyback transformer T2 158 and rectifier D7 159.

After a finite start-up time the low voltage output 163 stabilizes and switch-mode controller 155 pulls the gate voltage of MOSFET Q4 low which effectively removes the bootstrap circuitry 154 from loading the high voltage dc supply 153 line. Resistor R6 remains in circuit but is of high value as to limit power consumption. The topology shown is representative of the flyback switch-mode method of dc-to-dc conversion. High voltage MOSFET Q5 160 is turned fully on or off at a high switching frequency (greater than 10 KHz) in response to voltage and current feedback signals in order to regulate the +12 Vdc supply voltage 45. Flyback transformer T2 158 primary winding 161 is switched directly across the high voltage input when high voltage MOSFET Q5 160 is turned on. Current linearly ramps up in the primary winding storing an amount of magnetic energy per cycle defined by the equation: $E = \frac{1}{2} \cdot Lp \cdot Ipk^2$, where Lp is the primary inductance and Ipk is the peak primary current.

When high voltage MOSFET Q5 160 is turned off, the secondary windings (auxiliary power winding 157 and secondary winding 162) commutate or "flyback" and return the stored energy into filter capacitor C4 156 and capacitor C1 44 through rectifiers D7 and D6 168, respectively. This switch-mode action repeats at a high frequency, which allows the use of small, and inexpensive low loss ferrite cores for flyback transformer T2 158. Switching action is regulated on a cycle-by-cycle basis with control provided by the switch-mode controller 155 such that the +12 Vdc supply voltage 45 is maintained at a constant value. Switching action control, on a cycle-by-cycle basis, is provided by comparing the feedback line 164 to an internal reference combined with monitoring of Ipk 165. If the feedback line 164 exceeds the internal threshold then switching action is terminated. Feedback is provided by auxiliary power winding 157 rectified output. Switching action is also terminated on a cycle-by-cycle basis if Ipk 165 of primary winding 161 exceeds a preset level resulting from the voltage developed across resistor R7 166. A snubber RC diode network 167 is provided to reduce transformer T2 primary winding 161 voltage switching peaks in order to prevent damage of high voltage MOSFET Q5 160. The described switch-mode power supply represents the "flyback" topology. It is appreciated that other switch-mode topologies may be employed to reduce the high dc voltage supply 153 down to a lower +12 Vdc supply voltage 45 compatible with solid-state electronics including forward mode buck, push-pull, half-bridge, and full bridge conversion. The remaining power supply module 108c circuitry including microcontroller, energy storage, and communications means functions similarly as previously described in the second example of the power supply module 108b.

Referring now to FIG. 6, the electronic obstruction light beacon module 104 is shown. The electronic obstruction light beacon module 104 electronics are housed in a conductive metallic enclosure 176, which is galvanically and mechanically coupled to the conductive support tube 107 and bonded 181 to system ground 43. Power for the electronic obstruction light beacon module 104 is provided by the power supply module 108 through multi-conductor wire cable 111. Multi-conductor wire cable 111 is routed through the conductive support tube 107. The low voltage +12 Vdc supply voltage 45 provides power for the electronic obstruction light beacon module 104. Microcontroller U2 171 operates on +5 Vdc derived from the +12 Vdc supply voltage 45 and a 5V regulator 180. This allows continued operation under decreasing +12 Vdc supply voltage 45 levels as the result of transmission line 105 voltage loss. Note that the +12 Vdc supply voltage 45 level is maintained by the high energy capacitor bank 132 and/or battery 135 combination under conditions of transmission line 105 loss. It is appreciated that, under conditions of transmission line 105 loss, the +12 Vdc supply voltage 45 level decays at a rate determined by the effective load impedance and energy capacity of the high energy capacitor bank 132 and/or battery 135 combination.

A series string of light emitting diodes (LEDs) 182 provides a high intensity, long life, solid-state light source, the output of which may be optically diffused through the employment of a polycarbonate lens system 170. Alternatively other types of light emitting devices such as incandescent lamps, fluorescent lamps, etc. may be used. The polycarbonate lens system distributes the light substantially uniformly about approximately 360 degrees in azimuth and 90 degrees in elevation (from horizontal) in order to provide aeronautical visibility from all approach vectors. The series configuration of LEDs 182 is used to provide matched individual LED current which translates to uniform individual LED brightness. The series LEDs 182 are shown having five individual LEDs 182 in each bank. It is appreciated that configurations having more or less LEDs 182 can easily be accommodated through adjustment of the driving potential source levels. Two similar, high efficiency switch-mode constant current boost converters 183 are utilized to drive each string of series LEDs 182 with output drive 184 controlled in an on-off fashion through digital output 185 of micro-controller U2 171. Resistors R8 and R9 186 provide micro-controller U2 171 with an analog signal representative of the individual current in each string of series LEDs 182 which in turn provides an indication of LED functionality for diagnostic and alarm purposes. Having two separate LED light sources provides a degree of redundancy should an individual string of series LEDs 182 or constant current boost converter 183 fail.

An ambient light sensor 177 provides micro-controller U2 171 with ambient light condition data in order to make programmed light flash and intensity visibility adjustments.

A GPS receiver module 173 combined with GPS antenna 172 provides accurate time-of-day information through a serial data channel 199 to micro-controller U2 171. This information may be used by micro-controller U2 171 to accurately time synchronize flashing of multiple electronic obstruction light beacon modules 104 in order to provide enhanced visibility of a lighted transmission line section. Time-of-day synchronization may also be used to vary flash patterns and/or intensities to accommodate day or night conditions. The GPS receiver module 173 may also provide an accurate high frequency clock 193 to the micro-controller U2 171. This may be used as the operating clock for the micro-controller U2 171. Alternatively, other types of time synchronization reception circuitry may be utilized to provide a time based to micro-controller U2 171 for flash synchronization.

RF data link transceiver 69, combined with antenna 76, provides a full duplex communications link between the micro-controller U2 171 and a control/monitoring station or other obstruction light(s). RF data link transceiver 69 may, for example, be a 900 MHz secure data transceiver. This communications link provides a means of remote alarm and diagnostic monitoring combined with program upload capability. It additionally provides for communications between multiple electronic obstruction light beacon modules 104 for flash synchronization purposes.

Flash time synchronization of multiple obstruction lights may be completely user specified in order to allow unique simultaneous or sequential strobe flashing combined with individually programmed flash rates and duty-cycles.

High pass filter elements 189 and 190 function to protect the input circuitry of the GPS receiver module 173 and RF data link transceiver 69 from DC and low frequency signals (such as 50 or 60 Hz) that may arise due to the high electric field potentials that exist in the proximity of the antenna elements. Low frequency and DC components are effectively "shunted" to the conductive metallic enclosure 176, which in turn is connected to the system ground 43 while allowing the desired on channel frequency components to pass with little attenuation. The high pass filter elements 189 and 190 may utilize passive inductive, capacitive, and transmission line components.

Conductive toroidal ring 191 (FIG. 2) functions to reduce and displace the electric field intensities about the conductive metallic enclosure 176 and peripheral attachments including the GPS antenna 172, antenna 76, polycarbonate lens system 170, and ambient light sensor 177.

Figure 7:
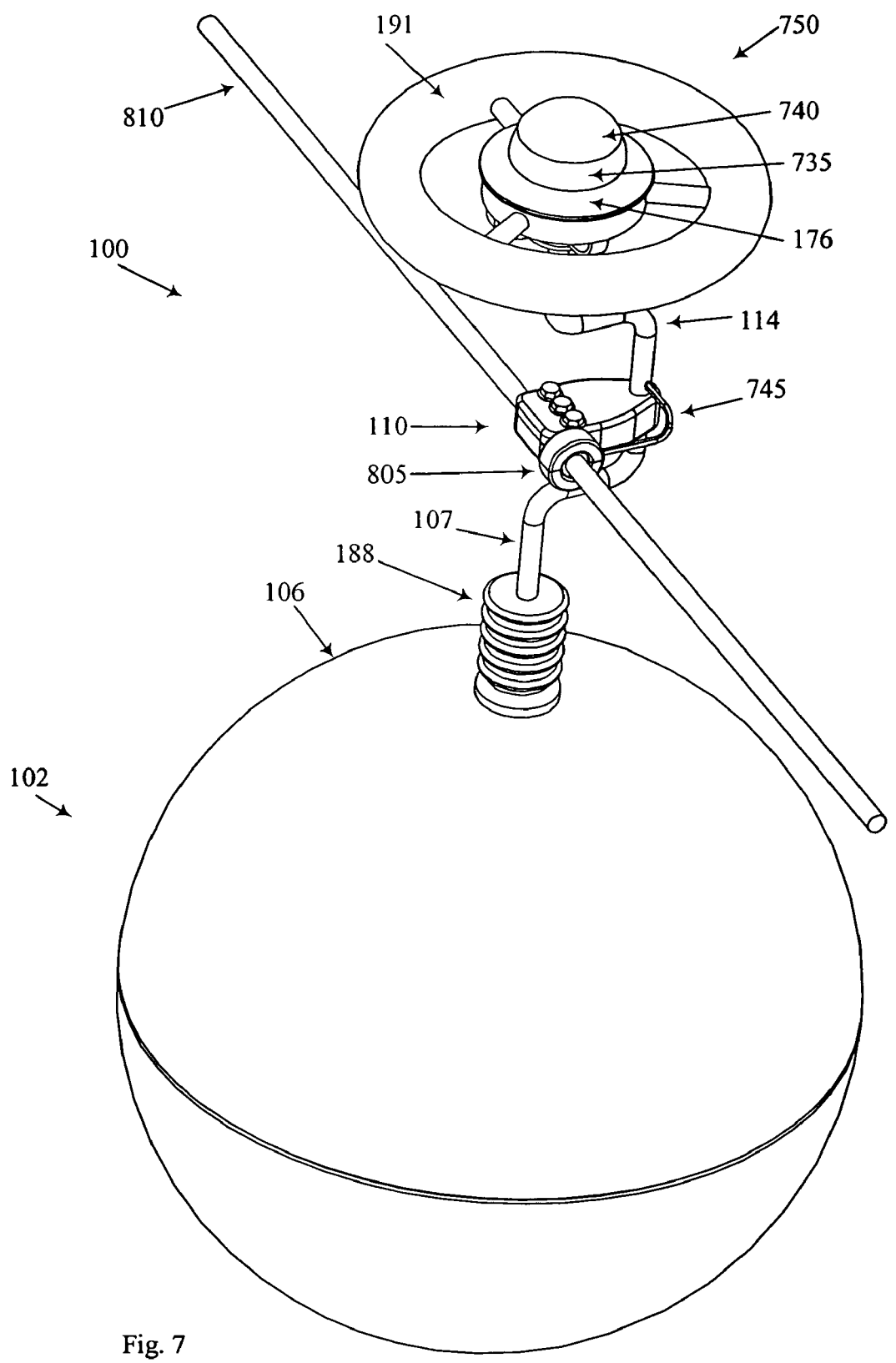
FIG. 7 depicts a third example of a high voltage transmission line attachable device of the present invention coupled to a power line.

Referring now to FIG. 7, another example of the HVT-LAD 100 is shown. This example includes a measurement module 750 and a current sensor 805. The current sensor may be an active CT, a passive CT, a Rogowski coil, an optical CT, a Hall effect device, etc. The current sensor 805 senses the current flowing in a high voltage current carrying conductor 810 (such as a transmission line). The measurement module 750 includes electronics for measuring parameters such as voltage, current and temperature. This example of the HVTLAD 100 includes additional components described previously with respect to other examples of the HVTLAD 100.

Figure 8:
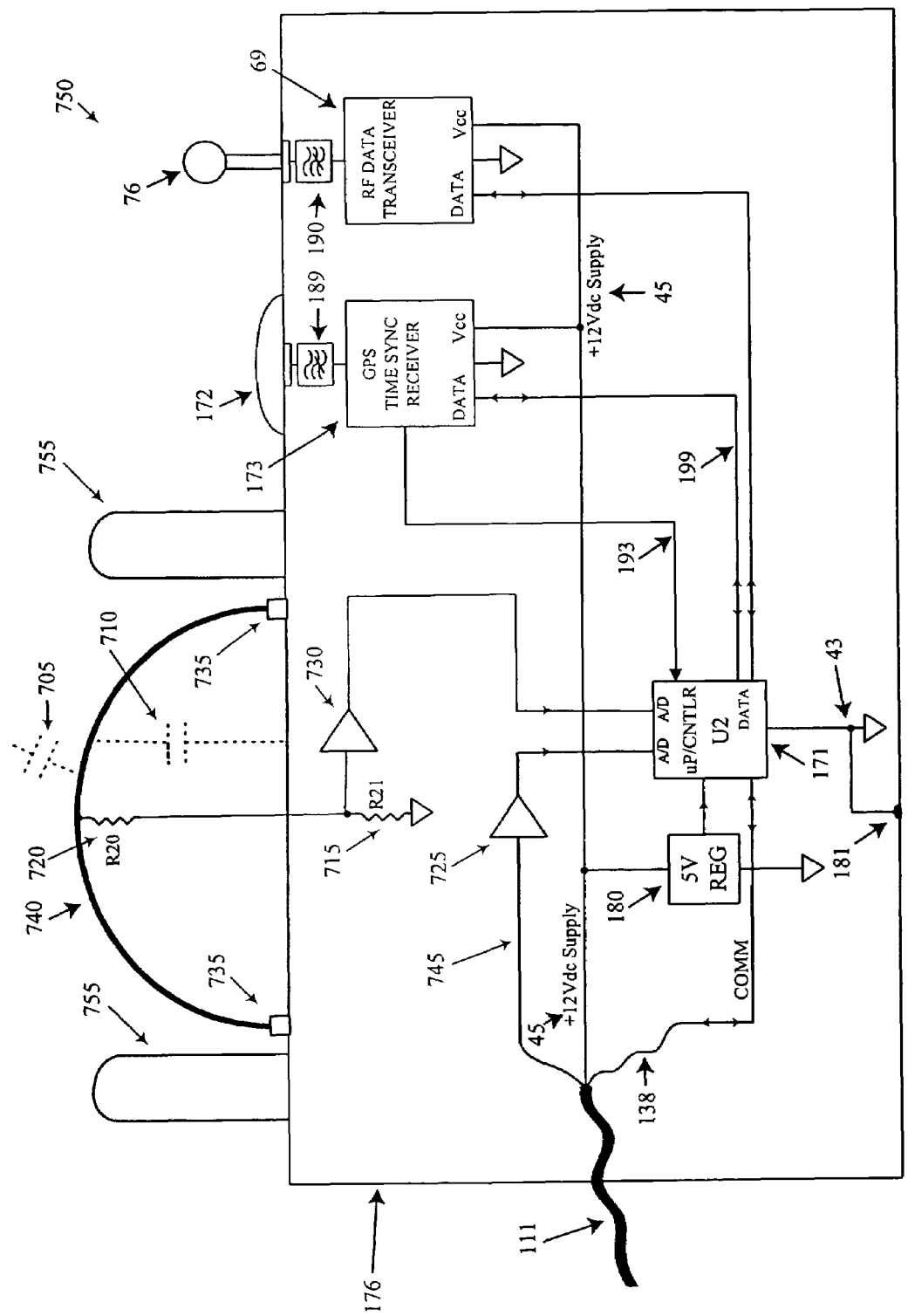
FIG. 8 depicts a schematic diagram of the third example of a high voltage transmission line attachable device of the present invention.

Referring now to FIG. 8, a combination electrical/mechanical block diagram of the measurement module 750 is shown. Some elements of the measurement module 750 are similar to those of the electronic obstruction light beacon module 104 therefore only differences are described hereafter.

The measurement module 750 includes a metallic (or other conductive material) plate 740 which is insulated by insulators 735 from the conductive metallic enclosure 176. In the illustrated example, the metallic plate 740 is in the form of a dome, although this is not necessary. A first inherent capacitance 710 is formed between the metallic plate 740 and the conductive metallic enclosure 176. A second inherent capacitance 705 is formed between the metallic plate 740 and the environment in a similar fashion as the conductive sphere 106 described previously. Resistor R20 720 is connected to the metallic plate 740 and in conjunction with resistor R21 715 forms a resistive divider capable of feeding an analog signal indicative of the voltage on metallic plate 740 to amplification circuitry 730. Amplification circuitry 730 feeds a scaled version of this voltage to an A/D input of microcontroller U2 171. This voltage is indicative of the voltage on high voltage current carrying conductor 810 due to the fact that inherent capacitances 705 and 710 form a capacitive divider between the conductive metallic enclosure 176 and an external reference such as ground or another phase conductor. Metallic (or other conductive material) electric field shields 755 in contact with conductive metallic enclosure 176 may be provided to shield the metallic plate 740 from stray electric fields.

Signal(s) indicative of current in the high voltage current carrying conductor are fed from the current sensor 805 to the amplification circuitry 725 through line 745 which passes through multi-conductor wire cable 111. The output of amplification circuitry 725 is fed to an A/D input of microcontroller U2 171.

Microcontroller U2 171 samples the signals from amplification circuitry 725 and 730. These signals are indicative of voltage and current in the high voltage current carrying conductor 810. The microcontroller U2 171 may timestamp these samples using time indications received from GPS receiver module 173 and transmit the timestamped signals to a receiving device through RF data link transceiver 69. In addition, microcontroller U2 171 may make power calculations directly using the samples and transmit the results of these calculations through RF data link transceiver 69. Some of the results of the power calculations may include power parameters such as rms current, rms voltage, watts, VARs, VAs, frequency, harmonics, phasors, etc.

During initialization, the microcontroller may also transmit appropriate calibration constants through RF data link transceiver 69 to a receiving device. This is so the receiving device can make accurate power calculations based on the samples if the samples are not individually calibrated by microcontroller U2 171.

Figure 9:
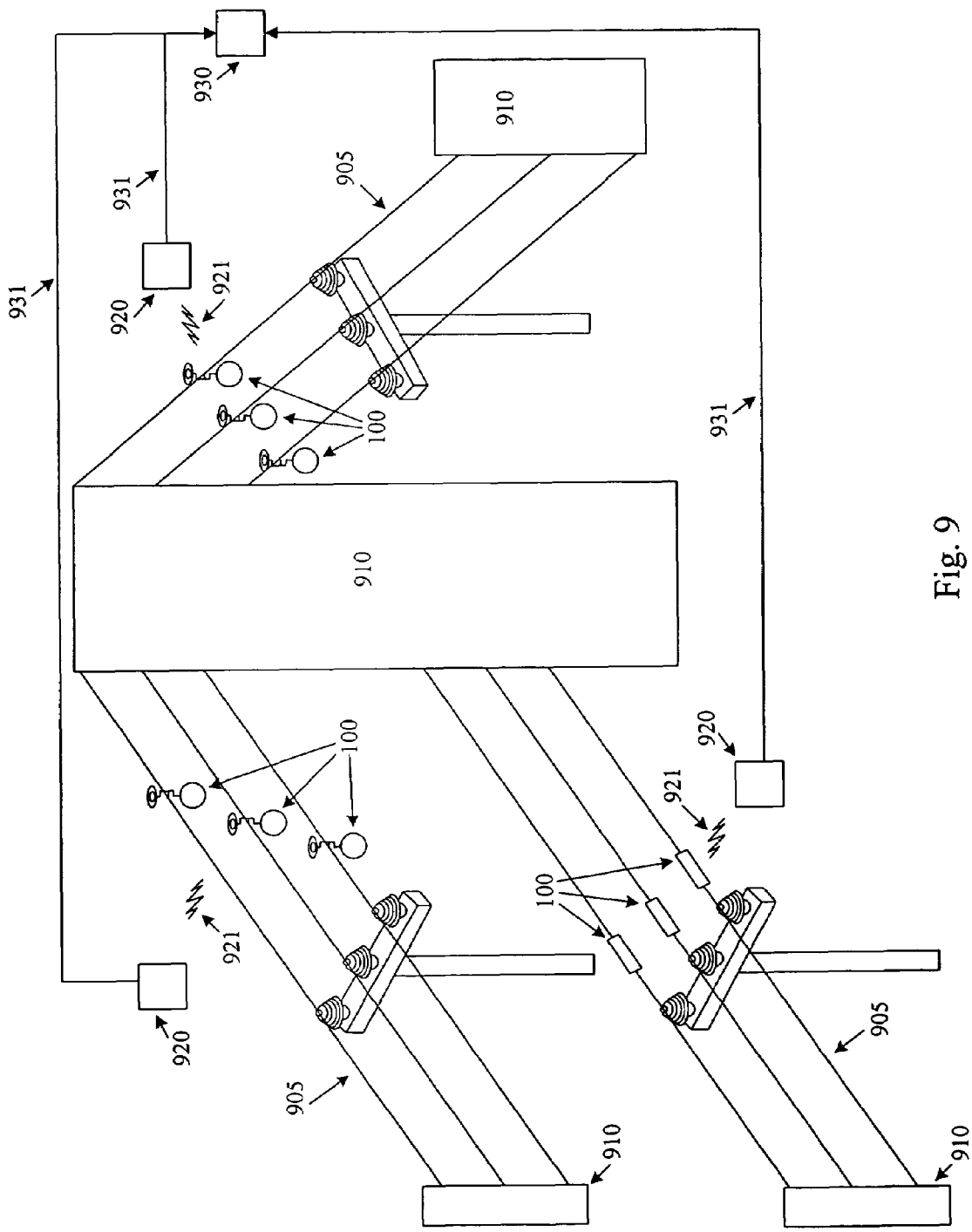
FIG. 9 depicts a system utilizing the high voltage transmission line attachable devices of the present invention.

Referring now to FIG. 9 an example grid stability monitoring system incorporating the HVTLAD 100 is shown. Various transmission lines 905 form a portion of an electric grid 900. As known in the art, the remainder of the grid 910 consists of many transmission lines, distribution lines, transformers, substations, generators, loads and other electrical equipment (not shown). The transmission lines 905 serve to interconnect various parts of the grid. Various HVTLADs 100 are installed on the different transmission lines 905 and at different points on the same transmission lines 905. The HVTLADs 100 transmit voltage and/or current information to local receiving stations 920 over wireless links 921. The local receiving stations 920 in turn communicate at least one of voltage, voltage phase information, current, current phase information, power, frequency, etc. to a monitoring station 930 over communication links 931.

A number of factors may be considered when analyzing the stability of an electrical grid. One factor is voltage. In general, the closer the voltage at every given point in the grid is to the expected nominal voltage, the more stable the grid is. A second factor is voltage phase. In general, it is desirable to keep the relative voltage phase of all points in the transmission grid to within about 60-70 degrees of one another. In addition, if a discontinuity in voltage phase is detected, this may be an indication of grid instability. A third factor is frequency. In general, the closer the frequency at a given point in the transmission grid is to other points within the grid, the more stable the grid is. In the system shown in FIG. 9, due to the fact that the monitoring station 930 can receive at least one of these indications from the various HVTLADs 100 and these indications are accurately timestamped or time synchronized as described above, grid stability can be analyzed by either a user or a computer system within the monitoring station 930. This may be done by display of the information from the HVTLADs 100 on a display in the monitoring station 930 and/or analysis within the computer system. An indication of grid stability is thus attained and if the grid is not sufficiently stable, mitigation activities can either manually or automatically be undertaken. As described above, each HVTLAD 100 may have a GPS receiver module 173 which provides position information. Alternatively, the HVTLAD 100 may have another type of RF based positioning and/or time synchronization receiver. By correlating this position information with information on where particular elements of the electrical grid 900 are located, the installation location of any given HVTLAD 100 may be determined without having to record the position of the HVTLAD 100 during installation. In addition, with position information from multiple HVTLADs 100 in the grid, a map of the grid including, the voltage, current, frequency, phase, etc. can be developed and/or displayed in the monitoring station 930. The monitoring station 930 may not necessarily be operated by the same company or entity that owns the transmission grid itself.

Multiple HVTLADs 100 on a transmission line 905 may also be used for fault detection and/or location. Using the voltage and current samples taken by each HVTLAD 100, the HVTLAD 100, local receiving stations 920 or monitoring station 930 can calculate the impedance of the line seen by the HVTLAD 100 at each point on the transmission line 905. This information can be used to triangulate the location of a fault or determine that power is flowing through an unexpected path. Alternatively, or in addition, analysis of the waveforms of voltage and or current seen by each HVTLAD 100 can be used for fault detection and/or location.

Having multiple HVTLADs 100 at various points on the transmission lines 905 of the electric grid 900 allows for the detection of congestion in the electrical grid 900. For instance if a transmission line 905 is nearing its capacity, the price charged for use of that transmission line 905 by a producer or consumer of electricity may be increased. Alternatively or in addition, this information may be used to reroute power flow through a different path in the electrical grid. In a similar manner, if electricity flow is below the capacity of a given transmission line 905 by a given amount, the price charged for use of that transmission line 905 may be decreased or additional flow may be routed to that transmission line 905. This functionality may be particularly valuable in a deregulated utility environment where the owners of the transmission lines 905 may not be the same as the owners of the generation facilities connected to the transmission lines 905.

The antenna 76 on the HVTLAD 100 and/or the antenna in the local receiving stations 920 may be of directional type to reduce the likelihood of interference or tampering with the RF link between the two. A directional antenna focuses radio frequency energy emanating from said radio frequency transmitter. In addition, the shape of the HVTLAD 100 and/or position of corona rings 30, 191 of the HVTLAD may also serve to shield antenna 76 from extraneous RF energy and prevent RF energy from the antenna 76 from propagating in certain directions.

It will be appreciated that although a few examples of the invention incorporating the power supply module 108 have been presented and described, many more examples of HVTLAD 100 devices are possible. The following sections discuss additional examples that have been conceived.

Mesh Network

A mesh network can be formed by mounting multiple HVTLADs 100 along a transmission line and on different transmission lines within appropriate proximity. Each HVTLAD 100 has an RF data link transceiver 69 which can communicate with adjacent HVTLADs 100. With appropriate gateways to other networks, such as the Internet or an intranet, the HVTLADs 100 may provide for communication links across geography which may not already have such links.

Drone

By mounting appropriate mechanical and/or robotic hardware to the HVTLAD 100, the HVTLAD 100 may be made operative to traverse the power line. For example, powered wheels may be mounted to the HVTLAD 100 and the HVTLAD 100 may no longer be clamped to the power line. The wheels may be appropriately attached to the power line and using the power provided by power supply module 108, electric motor(s) may be driven to move the HVTLAD 100 along the power line. The drone HVTLAD 100 may be equipped with a video camera and thus be used to traverse the power line looking for faults in the line, insulators, towers, etc. or for general video surveillance. The drone HVTLAD 100 may also or alternatively be equipped with a vibrating motor, electronically driven hammer, etc. operative to vibrate or impact the power line at a given point in order to dislodge ice.

Display

The HVTLAD 100 may be equipped with a display such as an LED, LCD, etc. The display may be powered from the power supply module 108. The display may be used to display advertising to persons near the HVTLAD 100. Other displays include highway information signs, "Amber" alert messages etc. The display functionality of the HVTLAD 100 may be combined with the drone functionality to create a moving display.

Other Power Sources

Complementing the power supply module 108, the HVTLAD 100 may have complimentary power sources such as solar panels, wind turbines, etc. When additional power is available from these sources, additional functionality of the HVTLAD 100 may be enabled.

Satellite/PLC Links

In addition to the GPS receiver, the HVTLAD 100 may comprise additional satellite communication transceivers. In addition or alternatively, the HVTLAD 100 may comprise a power line carrier transceiver. These may enable the transmission or reception of sensor or other data (such as advertising content or drone movement directions).

Radar Warning

The HVTLAD 100 may comprise a transmitter or transceiver operative to trigger an aircraft's radar. This may be useful when fog or other obstructions prevent the pilot of the aircraft from seeing the light emitted by the HVTLAD 100. In addition, the HVTLAD 100 may transmit warning tones on various RF frequencies for the same purpose.

Analog Radio

Although as described above, data indicative of voltage, current, power, etc. may be transmitted in digital form, this data may also be transmitted in analog form from the HVTLAD 100 to a local receiving station 920.

Fiber Repeater

In new installations, it is common that transmission lines have fiber optic cables within them. The HVTLAD 100 may be used as a fiber optic repeater. The fiber optic signal may enter the HVTLAD 100 within the transmission conductor 10 as shown in FIG. 1 and be amplified by appropriate circuitry within the HVTLAD before exiting the HVTLAD 100.

Additional Sensors

The HVTLAD 100 may alternatively or in addition be supplied with other sensors. A first example of an additional sensor is a temperature sensor operative to determine the temperature of the power line. This sensor may use infrared technology and may provide an indication of overheating of the power line. A second example of an additional sensor is a vibration or acceleration sensor. This sensor may provide an indication of stress on the power line from wind, ice, earthquake, impact, etc. A third example of an additional sensor is strain or tension sensor operative to sense the tension within the power line. This may also be an indication of stress on the power line. A fourth example of an additional sensor is a humidity sensor. Humidity may be used as a parameter in determining the current carrying capacity of the power line. A fifth example of an additional sensor is an air quality sensor. This sensor may be used generally to provide information to a remote site or may be used in estimating the affect of air impurities on the power line (due to corrosion, etc.). A sixth example of an additional sensor is a sound sensor. This sensor may be used to provide information to a remote site of local sound level. A seventh example of an additional sensor is an atmospheric pressure sensor operative to provide such information to a remote site for various purposes.

It is therefore intended that the foregoing detailed description be regarded as illustrative rather than limiting, and that it be understood that it is the following claims, including all equivalents, that are intended to define the spirit and scope of this invention.

We claim:

1. An apparatus for mounting on a power line carrying a high AC line voltage, the apparatus comprising:
   a conductive body having a body capacitance;
   a power supply comprising at least two input terminals; a first of said at least two input terminals coupled to said conductive body and a second of said at least two input terminals operative to be coupled to said power line;

electronic circuitry coupled to said power supply;
wherein a primary current flows through said power supply between said conductive body and said power line and said power supply converts said primary current into a supply of power at a voltage substantially lower than said high AC line voltage for operation of said electronic circuitry.

2. The apparatus of claim 1 wherein said voltage substantially lower than said high AC line voltage is below 100 volts DC.

3. The apparatus of claim 1 wherein said electronic circuitry comprises:
a sensor operative to sense at least one parameter.

4. The apparatus of claim 3 wherein said at least one parameter comprises at least one of ambient temperature, internal temperature, temperature of said power line, strain, humidity, elevation, position, ambient light level, air quality, vibration, acceleration, sound level and atmospheric pressure.

5. The apparatus of claim 4 wherein said electronic circuitry further comprises:
a radio frequency transmitter operative to transmit said parameter to a remote device which is not physically coupled to said apparatus.

6. The apparatus of claim 5 wherein said electronic circuitry further comprises:
a radio frequency positioning receiver operative to receive position information and determine the position of said apparatus.

7. The apparatus of claim 5 further comprising:
a directional antenna coupled to said radio frequency transmitter and operative to focus radio frequency energy emanating from said radio frequency transmitter.

8. The apparatus of claim 3 wherein said electronic circuitry further comprises:
a wireless transmitter operative to transmit said parameter to a remote device which is not physically coupled to said apparatus.

9. The apparatus of claim 8 wherein said wireless transmitter is a radio frequency transmitter.

10. The apparatus of claim 8 further comprising:
a directional antenna coupled to said wireless transmitter and operative to focus radio frequency energy emanating from said wireless transmitter.

11. The apparatus of claim 8 wherein:
said electronic circuitry further comprises a processor operative to secure data incorporating said parameter; and
said wireless transmitter is operative to transmit said data.

12. The apparatus of claim 8 wherein said electronic circuitry further comprises:
a radio frequency positioning receiver operative to receive position information and determine the position of said apparatus.

13. The apparatus of claim 1 wherein said electronic circuitry comprises a current sensor operative to sense current flow in said power line.

14. The apparatus of claim 13 wherein said current sensor comprises at least one of a Hall effect sensor, a Rogowski coil, a magnetic core current transformer and an optical current transducer.

15. The apparatus of claim 13 wherein said current sensor comprises an active current transformer.

16. The apparatus of claim 13 further comprising:
at least one analog to digital converter coupled to said current sensor;
a processor coupled to said at least one analog to digital converter and operative to receive digital samples representative of said current flow in said power line from said analog to digital converter; and
a wireless transmitter coupled to said processor and operative to transmit said digital samples to a remote device which is not physically coupled to said apparatus.

17. The apparatus of claim 16 wherein said wireless transmitter is a radio frequency transmitter.

18. The apparatus of claim 17 further comprising:
a directional antenna coupled to said radio frequency transmitter and operative to focus radio frequency energy emanating from said radio frequency transmitter.

19. The apparatus of claim 16 wherein said wireless transmitter is a laser.

20. The apparatus of claim 16 wherein said electronic circuitry further comprises:
a radio frequency positioning receiver coupled to said processor, operative to receive position information and determine the position of said apparatus.

21. The apparatus of either of claims 8 or 16 wherein said electronic circuitry further comprises:
a wireless receiver; and
a processor coupled with said wireless receiver and said wireless transmitter; said processor operative to integrate said apparatus into a mesh network.

22. The apparatus of claim 13 further comprising:
at least one analog to digital converter coupled to said current sensor;
a processor coupled to said at least one analog to digital converter and operative to receive digital samples representative of said current flow in said power line from said analog to digital converter;
a time synchronization receiver coupled to said processor; and
wherein said processor is operative to associate at least one timestamp from said time synchronization receiver with said digital samples.

23. The apparatus of claim 22 further comprising a radio frequency transmitter coupled to said processor and operative to transmit said digital samples to a remote device which is not physically coupled to said apparatus.

24. The apparatus of claim 23 wherein said time synchronization receiver further comprises:
a radio frequency positioning receiver operative to receive position information and determine the position of said apparatus.

25. The apparatus of claim 23 further comprising a directional antenna coupled to said radio frequency transmitter and operative to focus radio frequency energy emanating from said radio frequency transmitter.

26. The apparatus of claim 13 wherein said electronic circuitry comprises a voltage sensor operative to sense voltage on said power line.

27. The apparatus of claim 26 wherein said electronic circuitry comprises
at least one analog to digital converter coupled to said voltage sensor and said current sensor; and
a processor coupled to said at least one analog to digital converter and operative to receive digital samples representative of said current flow in said power line and said voltage on said power line from said analog to digital converter.

28. The apparatus of claim 27 wherein said current sensor comprises at least one of a Hall effect sensor, a Rogowski coil, a current transformer and an optical current transducer.

29. The apparatus of claim 27 wherein said current sensor comprises an active current transformer.

30. The apparatus of claim 27 wherein said processor is operative to calculate power flow in said power line using said digital samples.

31. The apparatus of claim 30 further comprising a radio frequency transmitter coupled to said processor and operative to transmit the result of said power flow calculation to a remote device.

32. The apparatus of claim 31 wherein said electronic circuitry further comprises:
a radio frequency positioning receiver coupled to said processor, operative to receive position information and determine the position of said apparatus.

33. The apparatus of claim 31 further comprising a directional antenna coupled to said radio frequency transmitter and operative to focus radio frequency energy emanating from said radio frequency transmitter.

34. The apparatus of claim 27 further comprising a radio frequency transmitter coupled to said processor and operative to transmit said digital samples to a remote device which is not physically coupled to said apparatus.

35. The apparatus of claim 34 wherein said electronic circuitry further comprises a radio frequency positioning receiver coupled to said processor, operative to receive position information and determine the position of said apparatus.

36. The apparatus of claim 34 further comprising a directional antenna coupled to said radio frequency transmitter and operative to focus radio frequency energy emanating from said radio frequency transmitter.

37. The apparatus of claim 27 further comprising:
a time synchronization receiver coupled to said processor; and
wherein said processor is operative to associate at least one timestamp from said time synchronization receiver with said digital samples.

38. The apparatus of claim 37 further comprising a radio frequency transmitter coupled to said processor and operative to transmit said digital samples to a remote device which is not physically coupled to said apparatus.

39. The apparatus of claim 38 wherein said time synchronization receiver further comprises a radio frequency positioning receiver operative to receive position information and determine the position of said apparatus.

40. The apparatus of claim 38 further comprising a directional antenna coupled to said radio frequency transmitter and operative to focus radio frequency energy emanating from said radio frequency transmitter.

41. The apparatus of claim 37 wherein said processor is operative to produce power flow data indicative of power flow in said power line using said digital samples.

42. The apparatus of claim 41 further comprising a radio frequency transmitter coupled to said processor and operative to transmit said power flow data to a remote device which is not physically coupled to said apparatus.

43. The apparatus of claim 42 wherein said radio frequency transmitter is further operative to transmit at least one of said digital samples to said remote device.

44. The apparatus of claim 42 wherein said time synchronization receiver further comprises a radio frequency positioning receiver operative to receive position information and determine the position of said apparatus.

45. The apparatus of claim 42 further comprising a directional antenna coupled to said radio frequency transmitter and operative to focus radio frequency energy emanating from said radio frequency transmitter.

46. The apparatus of claim 1 wherein said electronic circuitry comprises at least one light source.

47. The apparatus of claim 46 wherein said conductive body comprises a sphere.

48. The apparatus of claim 47 where said second of said at least two input terminals comprises a clamp operative to engage said power line.

49. The apparatus of claim 46 wherein said conductive body comprises a cylinder.

50. The apparatus of claim 46 wherein said electronic circuitry comprises at least one processor operative to control the lighting of said light source.

51. The apparatus of claim 50 wherein said electronic circuitry comprises time synchronization reception circuitry operative to provide an indication of time to said processor; said processor operative to control said lighting based on said indication of time.

52. The apparatus of claim 51 wherein said time synchronization reception circuitry comprises a GPS receiver.

53. The apparatus of claim 51 wherein said electronic circuitry further comprises a light sensor operative to sense ambient lighting conditions in the vicinity of said apparatus.

54. The apparatus of claim 53 wherein said processor is coupled to said light sensor and said light source; said processor operative to illuminate said light source when said light sensor indicates said ambient lighting conditions are below a threshold.

55. The apparatus of claim 46 further comprising an energy storage device coupled to said power supply and operative to supply power to said electronic circuitry when a condition exists such that said electronic circuitry demands more power than said power supply can produce.

56. The apparatus of claim 55 wherein said condition is the illumination of said light source.

57. The apparatus of claim 55 wherein said condition is the failure of said high AC line voltage.

58. The apparatus of claim 55 further comprising:
a processor operative to control the application of charge to said energy storage device.

59. The apparatus of claim 46 wherein said electronic circuitry further comprises a light sensor operative to sense ambient lighting conditions in the vicinity of said apparatus.

60. The apparatus of claim 59 wherein said electronic circuitry further comprises a processor coupled to said light sensor and said light source; said processor operative to illuminate said light source when said light sensor indicates said ambient lighting conditions are below a threshold.

61. The apparatus of claim 1 wherein said power supply comprises a transformer having at least a primary and a secondary winding, wherein said primary winding has a greater number of turns than said secondary winding.

62. The apparatus of claim 61 wherein said power supply comprises:
a capacitor;
a rectification circuit coupled to said capacitor and operative to allow said capacitor to charge to a DC voltage from said power flow;
a controller operative to prevent and allow the flow of current through said primary winding from said capacitor;
a filter circuit coupled to said secondary winding and operative to produce said voltage substantially lower than said high AC line voltage; and a feedback circuit coupled to said filter circuit and said controller wherein said controller uses the output of said feedback circuit to modulate said prevention and allowance of current flow in order to regulate said voltage substantially lower than said high AC line voltage.

63. The apparatus of claim 62 further comprising an energy storage device coupled to said DC voltage substantially lower than said high AC line voltage and operative to supply power to said electronic circuitry for a period of time if said high AC line voltage fails.

64. The apparatus of claim 63 further comprising a processor operative to control the application of charge to said energy storage device.

65. The apparatus of claim 62 wherein said electronic circuitry comprises a sensor operative to sense at least one parameter.

66. The apparatus of claim 62 wherein said electronic circuitry further comprises a radio frequency transmitter operative to transmit data to a remote device which is not physically coupled to said apparatus.

67. The apparatus of claim 66 wherein said electronic circuitry further comprises a radio frequency positioning receiver operative to receive position information and determine the position of said apparatus.

68. The apparatus of claim 66 further comprising a directional antenna coupled to said radio frequency transmitter and operative to focus radio frequency energy emanating from said radio frequency transmitter.

69. The apparatus of claim 62 wherein said electronic circuitry comprises at least one light source.

70. The apparatus of claim 62 wherein said electronic circuitry further comprises an electric motor operative to propel said apparatus along said power line.

71. The apparatus of claim 62 wherein said electronic circuitry comprises at least one of a radar transmitter, fiber optic transmitter, a power line carrier transceiver, a display, a mesh networking transceiver, a sound emitting device, a video surveillance device, an audio surveillance device, a radio frequency repeater, an information sign and an advertising sign.

72. The apparatus of claim 63 wherein said power supply further comprises at least one of a solar panel and a wind turbine.

73. The apparatus of claim 61 wherein said power supply comprises:
a rectification circuit coupled across said secondary winding;
a capacitor coupled to the output of said rectification circuit and operative to produce a DC voltage substantially lower than said high AC line voltage;
a regulator coupled to said capacitor and operative to regulate said DC voltage substantially lower than said high AC line voltage; and
wherein said primary winding is coupled in series between said conductive body and said power line.

74. The apparatus of claim 73 further comprising an energy storage device coupled to said DC voltage substantially lower than said high AC line voltage and operative to supply power to said electronic circuitry for a period of time if said high AC line voltage fails.

75. The apparatus of claim 74 further comprising a processor operative to control the application of charge to said energy storage device.

76. The apparatus of claim 73 wherein said electronic circuitry comprises a sensor operative to sense at least one parameter.

77. The apparatus of claim 73 wherein said electronic circuitry further comprises a radio frequency transmitter operative to transmit data to a remote device which is not physically coupled to said apparatus.

78. The apparatus of claim 77 wherein said electronic circuitry further comprises a radio frequency positioning receiver operative to receive position information and determine the position of said apparatus.

79. The apparatus of claim 77 further comprising a directional antenna coupled to said radio frequency transmitter and operative to focus radio frequency energy emanating from said radio frequency transmitter.

80. The apparatus of any of claims 5, 23, 31, 34, 38, 42, 66 or 77 wherein said electronic circuitry further comprises:
a radio frequency receiver;
a process coupled to said radio frequency receiver and said radio frequency transmitter; said process operative to integrate said apparatus into a mesh network.

81. The apparatus of claim 73 wherein said electronic circuitry comprises at least one light source.

82. The apparatus of claim 81 wherein said electronic circuitry further comprises a light sensor operative to sense ambient lighting conditions in the vicinity of said apparatus.

83. The apparatus of claim 82 wherein said electronic circuitry further comprises a processor coupled to said light sensor and said light source; said processor operative to illuminate said light source when said light sensor indicates said ambient lighting conditions are below a threshold.

84. The apparatus of claim 81 wherein said electronic circuitry comprises time synchronization reception circuitry operative to provide an indication of time to said processor; said processor operative to control said lighting based on said indication of time.

85. The apparatus of claim 73 wherein said electronic circuitry further comprises an electric motor operative to propel said apparatus along said power line.

86. The apparatus of claim 73 wherein said electronic circuitry comprises at least one of a radar transmitter, fiber optic transmitter, a power line carrier transceiver, a display, a mesh networking transceiver, a sound emitting device, a video surveillance device, an audio surveillance device, a radio frequency repeater, an information sign and an advertising sign.

87. The apparatus of claim 73 wherein said power supply further comprises at least one of a solar panel and a wind turbine.

88. The apparatus of claim 1 wherein said electronic circuitry comprises at least one of a radar transmitter, fiber optic transmitter, a power line carrier transceiver, a display, a mesh networking transceiver, a sound emitting device, a video surveillance device, an audio surveillance device, a radio frequency repeater, an information sign and an advertising sign.

89. The apparatus of claim 1 wherein said power supply further comprises at least one of a solar panel and a wind turbine.

90. The apparatus of claim 1 wherein said electronic circuitry further comprises an electric motor operative to propel said apparatus along said power line.

91. The apparatus of claim 90 further comprising at least one of a video camera, vibrating motor and electronically driven hammer coupled to said electronic circuitry.

92. The apparatus of any of claims 1, 5, 8, 16, 23, 31, 34, 38, 42, 44, 51, 66, 77 or 88 wherein said conductive body comprises a sphere.

93. The apparatus of claim 92 where said second of said at least two input terminals comprises a clamp operative to engage said power line.

94. The apparatus of any of claims 1, 5, 8, 16, 23, 31, 34, 38, 42, 44, 51, 66, 77 or 88 wherein said conductive body comprises a cylinder.

95. The apparatus of claim 1 wherein said electronic circuitry comprises a voltage sensor operative to sense voltage on said power line.

96. A method of powering an apparatus mountable coupled with a power line carrying a high AC line voltage, the method comprising:
   mounting an apparatus having a conductive portion on a power line;
   connecting a first terminal of a power supply of the apparatus to the power line and connecting a second terminal of the power supply to the conductive portion such that a primary current flows between said power line and a body capacitance of the conductive portion of said apparatus;
   converting said primary current into a supply of power at a voltage substantially lower than said high AC line voltage; and
   providing said supply of power to electronic circuitry coupled to said apparatus.

97. The method of claim 96 wherein said high AC line voltage is greater than ten thousand volts.

98. The method of claim 96 wherein said electronic circuitry comprises at least one of a voltage sensor and a current sensor.

99. A power grid monitoring system comprising:
   at least two apparatus, each apparatus comprising:
   a conductive body having a body capacitance;
   a power supply comprising at least two input terminals; a first of said at least two input terminals coupled to said conductive body and a second of said at least two input terminals operative to be coupled to said power line;
   electronic circuit coupled to said power supply, the electronic circuitry operative to sense at least one of current flow with a current sensor and a voltage of said power line with a voltage sensor, the electronic circuit further comprising:
   at least one analog to digital converter coupled to said voltage sensor and said current sensor; and
   a processor coupled to said at least one analog to digital converter and operative to receive digital samples representative of said current flow in said power line and said voltage on said power line from said analog to digital converter;
   wherein a primary current flows through said power supply between said conductive body and said power line and said power supply converters said primary current into a supply of power at a voltage substantially lower than said high AC line voltage for operation of said electronic circuitry;
   at least two receiving devices each operative to receive data indicative of voltage from at least one of said at least two apparatus; and
   at least one monitoring device operative to receive said data indicative of voltage from said at least two receiving devices and at least one of display and analyze said data indicative of voltage from more than one location on said power grid.

100. A power grid monitoring system comprising:
   at least two apparatus, each apparatus comprising:
   a conductive body having a body capacitance;
   a power supply comprising at least two input terminal; a first of said at least two input terminals coupled to said conductive body and a second of said at least tow input terminals operative to be coupled to said power line;
   electronic circuitry coupled to said power supply, the electronic circuitry operative to sense at least one of a current flow with a current sensor and a voltage of said power line with a voltage sensor, the electronic circuit further comprising:
   wherein a primary current flows through said power supply between said conductive body and said power line and said power supply converts said primary current into a supply of power at a voltage substantially lower than said high AC line voltage for operation of said electronic circuitry;
   at least two receiving devices each operative to receive data indicative of voltage from at least one of said at least two apparatus;
   at least one monitoring device operative to receive said data indicative of voltage from said at least two receiving devices and at least one of display and analyze said data indicative of voltage from more than one location on said power grid;
   wherein said at least two receiving devices are further operative to receive said position information from at least one of said at least two apparatus; and
   wherein said at least one monitoring device is operative to receive said position information from said at least two receiving devices and display the position of said at least two apparatus.

* * * * *

UNITED STATES PATENT AND TRADEMARK OFFICE
CERTIFICATE OF CORRECTION

PATENT NO. : 7,282,944 B2  
APPLICATION NO. : 10/774088  
DATED : October 16, 2007  
INVENTOR(S) : Gunn et al.

Page 1 of 1

It is certified that error appears in the above-identified patent and that said Letters Patent is hereby corrected as shown below:

Column 10  
Line 5, change "1110" to --110--  
Line 8, change "1111" to --111--

Column 11  
Line 33, change "normally be" to --normally--  
Line 64, change "lip 37" to --IP 37--

Column 12  
Line 11, after "secondary turns,", change "may" to --may be--

Column 13  
Line 42, change "U1, 130" to --U1 130--

Column 14  
Line 60, after "D7", insert --159--

Column 22  
Line 60, after "comprises", insert --:--

Column 25  
Line 43, change "claim 63" to --claim 62--

Signed and Sealed this

Twenty-ninth Day of July, 2008

JON W. DUDAS  
*Director of the United States Patent and Trademark Office*